United States Patent [19]
Bellifemine et al.

[11] Patent Number: 6,122,320
[45] Date of Patent: Sep. 19, 2000

[54] CIRCUIT FOR MOTION ESTIMATION IN DIGITIZED VIDEO SEQUENCE ENCODERS

[75] Inventors: Fabio Bellifemine; Gianmario Bollano, both of Turin; Andrea Finotello, Settimo Torinese; Marco Gandini, Turin; Pierangelo Garino, Volpiano; Mauro Marchisio; Alessandro Torielli, both of Turin, all of Italy; Didier Nicoulaz, Lausanne, Switzerland; Stephanie Dogimont, Lausanne, Switzerland; Martin Gumm, Lausanne, Switzerland; Marco Mattavelli, Lausanne, Switzerland; Frederich Mombers, Lausanne, Switzerland

[73] Assignee: CSELT-Centro Studi e Laboratori Telecomunicazioni S.p.A., Turin, Italy

[21] Appl. No.: 09/180,781
[22] PCT Filed: Mar. 12, 1998
[86] PCT No.: PCT/EP98/01433
§ 371 Date: Nov. 13, 1998
§ 102(e) Date: Nov. 13, 1998
[87] PCT Pub. No.: WO98/42137
PCT Pub. Date: Sep. 24, 1998

[30] Foreign Application Priority Data

| Mar. 14, 1997 | [IT] | Italy | TO97A0209 |
| Jun. 5, 1997 | [IT] | Italy | TO97A0486 |
| Nov. 27, 1997 | [IT] | Italy | TO97A1035 |

[51] Int. Cl.$^7$ .................................................. H04N 5/262
[52] U.S. Cl. ............................ 375/240; 708/631; 708/107; 382/107; 382/241; 382/238
[58] Field of Search ............................ 375/240; 348/416, 348/402, 420, 407, 699; 382/236

[56] References Cited

U.S. PATENT DOCUMENTS

| 6,011,870 | 1/2000 | Jeng et al. ............................ 382/236 |
| 6,052,706 | 4/2000 | Wheeler et al. ........................ 708/631 |

OTHER PUBLICATIONS

Bursky D: "CODEC Compresses Images In Real Time" Electronic Design, vol. 41, No. 20, pp. 123/124, Oct. 1993.
Bennetts et al: "IEEE Standard 1149.1–1990 on Boundary Scan: History, Literature Survey, and Current Status" Journal of Electronic Testing, vol. 2, No. 1, pp. 11–25, Mar. 1999.

*Primary Examiner*—Chris S. Kelley
*Assistant Examiner*—Shawn S. An
*Attorney, Agent, or Firm*—Herbert Dubno

[57] ABSTRACT

The circuit for motion estimation in digitised video sequence encoders comprises at least an integrated circuit component (IM, IM1 . . . IMn) which is arranged to perform either the function of determining motion vectors and associated costs for different prediction modes, or the function of vector refinement, possibly in addition to prediction mode selection. The circuit (IM) is based on the use of two operating units (M1, M2) which are arranged to concurrently process in different ways different pixel groups according to a MIMD technique. Preferably, when the circuit performs motion vector determination, the operating units (M1, M2) are programmed to execute a genetic algorithm exploiting an initial vector population taking into account the temporal and spatial correlations in the picture.

39 Claims, 14 Drawing Sheets

| | A | | B | |
|---|---|---|---|---|
| Y1 | MB 0 | MB 45 | MB 1 | MB 46 |
| | MB 2 | MB 47 | MB 3 | MB 48 |
| BV 1 | STR 0 | STR 2 | STR 1 | STR 3 |
| C1 | MB 0 \| MB 2 \| MB 45 \| MB 47 | | MB 1 \| MB 3 \| MB 46 \| MB 48 | |
| Y2 | | | | |
| BV 2 | | | | |
| C2 | | | | |
| Y3 | | | | |
| BV 3 | | | | |
| C3 | | | | |
| Yr | MB 0 | MB 2 | MB 1 | MB 3 |
| Cr | MB 0 \| MB 2 | | MB 1 \| MB 3 | |
| CV | MB 0 \| MB 2 \| MB 45 \| MB 47 | | MB 1 \| MB 3 \| MB 46 \| MB 48 | |

CIRCUIT FOR MOTION ESTIMATION IN DIGITIZED VIDEO SEQUENCE ENCODERS

The invention described herein relates to digitised video signal processing, and in particular it concerns a circuit for motion estimation in encoding or compressing digitised video sequences. Hereinafter, reference will be made, by way of non-limiting example, to sequences conforming to international standard ISO/IEC 13818-2 (also known as ISO/MPEG2), but the invention can be applied to sequences encoded and decoded according to principles similar to those disclosed in the standard. For the sake of simplicity, those sequences shall hereinafter be referred to as MPEG2 video sequences or data.

As is well known, the standard specifies the encoded (or compressed) representation of video sequences for digital storage and digital video communications and defines the decoding process. The encoding process is not defined in the standard, and it is essentially a hybrid coding, using time prediction techniques with motion estimation (at the level of a pixel aggregate corresponding to one of the hierarchical levels defined by the standards, e.g. macro-block level) to reduce time redundancy, and two-dimensional transform techniques applied to a current picture or to the significant differences between the current picture and a predicted picture to reduce spatial redundancy. Information on the encoding procedures (e.g. with or without prediction and/or motion compensation), motion information and spatial information are then included into the sequence, which is transmitted or stored after encoding with a variable length code. Decoding entails processing the compressed sequences in successive steps, until recovering the original picture sequence, for its subsequent display. Greater detail can be found in the standard mentioned above as well as in standard ISO/IEC 11172-2 (ISO/MPEG1) and in the paper 'The MPEG video compression algorithm', by D. J. Le Gall, Signal Processing: Picture Communication, Vol. 4, No. 2, pp. 129 et seq.

Motion information generally includes one or more vectors (the number of which depends on the type of picture and on the type of prediction requested) representing a displacement of a luminance macro-block (16×16 pixels) in a current picture with respect to the position the macro-block has in one or more reference pictures, and a 'cost' function which provides an indication of the estimation error. A reference picture is a picture which was subjected to intra-picture encoding (I picture), i. e. a picture encoded by exploiting only the information contained in the picture itself, or a picture encoded with prediction (P picture), i. e. a picture for which the difference is encoded between the current picture and a picture obtained by means of a prediction with motion compensation starting from one or more past reference pictures. The vector(s) supplied by the motion estimation units is (are) the vector(s) which minimise(s) the cost function, i. e. motion estimation identifies the macro-block (s) that, in the reference picture(s), best match(es) the current macro-block. The motion information may also be used as a parameter for evaluating a coding cost function, to allow the application of the prediction strategy that results in the best trade-off between coding quality and amount of information to be transmitted.

The matching criteria (or cost functions) most commonly adopted in motion estimation are the mean absolute or mean square difference (or error) between the luminance pixels in the macro-block in the current picture and homologous pixels in macro-blocks within a search area in the reference picture. Theoretically, in order that the best matching macro-block is actually identified, all possible macro-block positions within the search area should be considered (full search) and, moreover, the search area should be relatively large to ensure a reliable estimation. Taking into account that a macro-block contains 256 pixels and that a number of vector/cost pairs are to be computed for each macro-block, it is clear that the computational burden inherent in motion estimation is very severe, especially if a real time estimation is to be carried out, as it can be necessary for a live broadcast. It has been estimated that billions of operations per second may be required.

As known to the skilled in the art, such a high processing power can be obtained only by means of a dedicated hardware, which preferably is to be made in integrated circuit form. It would be desirable to include both the processing units and the memories on the same chip, to avoid the need of transferring large amounts of data from an external memory to the processing units, what entails a limitation in the processing speed. Yet, at present, integrated circuit manufacturing technology does not allow forming processing units and memories on the same chip at reasonable costs, and hence use is to be made of external memories and of a processing technique in which the demand for new data at each operating cycle is compatible with the need to transfer such data from the external memory to the processing unit.

The commercial components and many of the proposals disclosed in the literature comply with such needs by performing a deterministic search (that is a search in which the locations of the search points are predictable) and by using the so-called systolic arrays of processors for performing the necessary computations. A systolic array is substantially a parallel processing system in which the individual units are associated with the pixels according to a certain law and are suitably connected so as to perform a substantially iterative calculation of the cost function. Deterministic search may be the full search mentioned above or a hierarchical search. The hierarchical search may be seen as a sequence of full searches in which the size of the grid where the search points are located varies from step to step, instead of being fixed. It is clear that, by such kind of search, by suitably choosing the step size and the scanning law in the search area, a substantial portion of a macro-block does not change from one step to the subsequent one so that the amount of new data to be supplied to the processing units at each step is kept limited.

Examples of solutions using systolic arrays are disclosed in the paper 'VLSI Architectures for Video Compression—A Survey', P. Pirsch et al., Proceedings of the IEEE, Vol. 83, No. 2, February 1995, pages 220 and ff. A solution based on a hierarchical search is specifically disclosed in the paper 'A Real-time Motion Estimation and Compensation LSI with Wide-Search Range for MPEG2 Video Encoding' presented by K. Suguri et al. at the 1996 IEEE International Solid State Circuits Conference, San Francisco (USA), Feb. 8–10, 1996, paper FP15.1.

A full search clearly identifies the best matching macro-block within the search area, but the processing power of the present circuits allows the search to be made within a rather limited area (a typical maximum displacement is ±8 pixels in the vertical direction and ±16 pixels in the horizontal direction); such area is clearly a very small fraction of the picture (which, according to CCIR601 or MPEG2 standards, comprises a pixel matrix with several hundred rows and columns), thus resulting in a quality which is not always satisfactory.

A hierarchical search like that disclosed in the paper by Suguri et al. (a three-step search algorithm in which the lowest step provides for a 4:1 sub-sampling of the data by considering only one pixel out of four in the search area, and the second and third steps perform a full search within ±1 and ±0.5 pixels, respectively) reduces the computational burden to an extent corresponding to the sub-sampling ratio, what cannot be sufficient, and moreover it is not applicable to half-pixel and dual prime motion estimation.

A different technique disclosed in the literature makes use of the so called 'genetic algorithms', which are used since some years for solving complex optimisation problems. Those algorithms represent heuristic methods that do not perform a full search in the search space, and hence do not guarantee the achievement of the sought absolute minimum of the cost function; yet they have proven to provide a solution that can be quite close to the absolute minimum. Use of such algorithms in motion estimation has been proposed by K. Hung-Kei Chow and Ming L. Liou in the article 'Genetic Motion Search Algorithm for Video Compression', IEEE Transactions on Circuits and Systems for Video Technology, Vol. 3, No. 6, December 1993, pages 440 and fol. The basic idea is to split the search for the best candidate vector in different steps (population generation). Each new population comprises genetic information (son vectors) obtained from the previous population by applying binary operations (crossover) on some best vectors (fathers) of the previous population.

A modification of such algorithm is disclosed in the paper 'A Low Complexity Motion Estimation Algorithm for MPEG-2 Encoding' presented by M. Mattavelli and D. Nicoulaz at the Hamlet RACE 2110 Workshop, Rennes, Feb. 27th–28th, 1996. The modifications aim to improve the quality of the estimation and to simplify the processing and mainly concern: the crossover operation, in which the crossover operators are no longer submitted to mutation; the generation of the first population of a macro-block by using the best vectors of a number of surrounding macro-blocks in the reference picture previously received; and the use of random vectors with a pseudo-Gaussian distribution.

The invention provides a highly flexible circuit for implementing a motion estimation based upon the above mentioned algorithm; the circuit may be used also to carry out a refinement of the candidate motion vectors obtained by a similar or different circuit, as well as in the selection of the prediction mode.

The features of the circuit according to the invention are defined in the appended claims.

The invention will now be disclosed in detail with reference to the accompanying drawings, in which.

Before describing the Figures in detail, we recall some definitions concerning the hierarchical arrangement of the pixels within a digitised picture and the prediction strategy as used in MPEG2 standard. Both luminance and chrominance samples (pixels) are grouped into blocks each made of an 8×8 matrix (8 rows of 8 pixels each); a certain number of luminance and chrominance blocks (e. g. 4 blocks of luminance data and 2 corresponding blocks of chrominance data) form a macro-block; the digitised picture then comprises a matrix of macro-blocks of which the size depends on the profile (i. e. on the resolution) chosen and on the power supply frequency: for instance, in case of 50 Hz power supply, the size can range from a minimum of 18×32 macro-blocks to a maximum of 72×120. Pictures can in turn have a frame structure (in which pixels of subsequent rows pertain to different fields) or a field structure (in which all pixels pertain to the same field). As a consequence, macro-blocks may have a frame or field structure, as well. Pictures are in turn organised into groups of pictures, in which the first picture is always an I picture, which is followed by a number of B pictures (bi-directionally interpolated pictures, which have been submitted to forward or backward prediction or to both, 'forward' meaning that prediction is based on a previous reference picture and 'backward' meaning that prediction is based on a future reference picture) and then by a P picture which, being used for prediction of the B pictures, is to be encoded immediately after the I picture.

Figure 1:
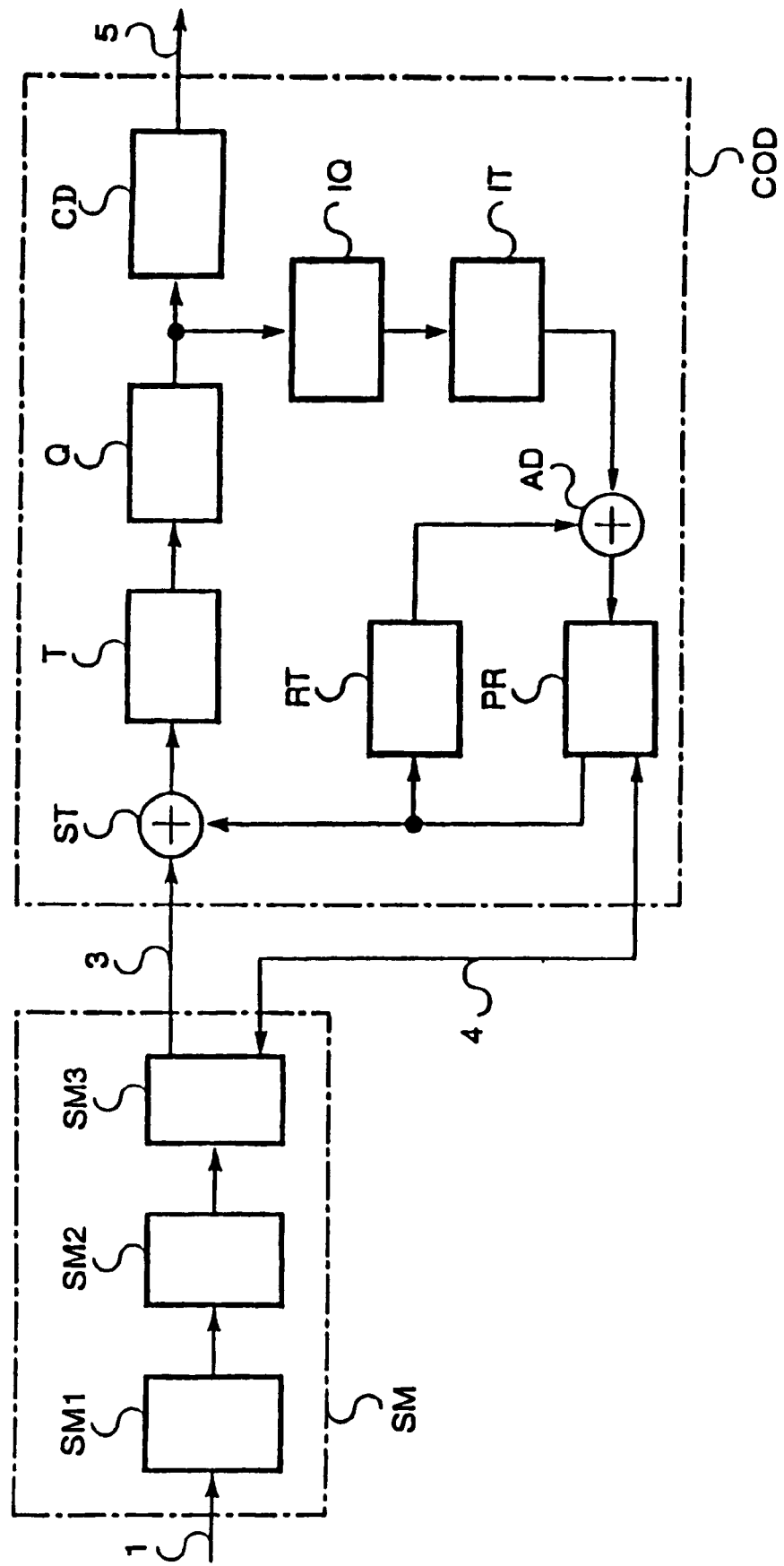
FIG. 1 is a schematic functional block diagram of an encoder capable of generating MPEG2 sequences.

Referring now to FIG. 1, a source, not shown, supplies the encoder or transmitter, through a line 1, with the digital samples arranged according to the hierarchical structure described above. It is assumed that the sequence on line 1 is already arranged in the coding order, i. e. an order making the reference pictures available before the pictures utilising them for prediction. The sample stream is received by a motion estimation unit SM which is to compute and emit one or more motion vectors for each macro-block in a picture being coded, and a cost or error associated with the or each vector. The terms 'cost' and 'error'—when referred to the vectors—will be used with the same meaning throughout the description. Block SM includes the memory necessary for storing also the reference picture(s).

Determination of the motion vector(s) for a macro-block may be seen in the most general cases as the sequence of three steps: the first step is the determination of a set of candidate vectors, the second step (which in many conventional encoders is dispensed with, so that the first step represents the actual motion estimation) is a refinement of the vectors computed in the first step, and the third step is a selection of the prediction mode. For that reason, block SM is shown as comprising three cascaded elements SM1, SM2, SM3 each entrusted with one of said steps. Block SM1 generates one candidate vector and the relevant cost for each type of prediction possible for a given macro-block structure: more specifically, for a 'frame' picture, prediction can be: 'frame', concerning the complete macro-block; 'field', concerning the two fields separately; 'dual prime', consisting of a double field prediction and of a crossed combination (top-bottom fields) of the two predictions to yield the predicted macro-block; for the field picture, prediction can be: 'field', 16×8 or 'dual prime', substantially analogous to the 'frame', 'field' and 'dual prime' predictions mentioned above, with the only difference that 'field' prediction may concern fields with the same or different parity and the 16×8 prediction concerns the upper or the lower half of the macro-block (8 consecutive rows). Block SM2 performs an exhaustive search within a so-called 'zone', that is a pixel set of pre-defined size slightly larger than the macro-block size, by weighting each candidate vector by a weight associated with the amount of bits required for transmitting the vector;

also SM2 generates a vector for each prediction type and a relevant cost. Lastly, block SM3 evaluates an overall encoding cost which may take into account, i. a., the cost inherent in the prediction and the cost of dispensing with prediction or motion compensation, determines the most suitable prediction strategy, i. e. the strategy which gives the better trade-off between quantity of information to be transmitted and quality, and provides the actual motion vector(s).

It is clear from the above description that, for performing its tasks, unit SM requires i. a. information about the picture characteristics, such as the size, the encoding type, the structure and the so called 'temporal reference' (that is, an information about the temporal displacement a picture has undergone when arranging the sequence in the coding order) and information about the weights for the refinement and the costs for the prediction selection. For sake of simplicity of the drawing, it is assumed that such information is present on line 1.

The video samples, the motion vector(s) and the prediction information are fed by SM, through a line 3, to the actual encoding (or compression) units, indicated in the whole by COD. At the input of COD, a subtractor ST subtracts, in case of P and B pictures, the reference picture or pictures, provided by a circuit PR that carries out prediction and motion compensation, from the current picture and feeds the difference to circuit T which computes a two-dimensional transform (in particular, a discrete-cosine transform) and is followed by a quantizer Q. The quantized information is fed on one side to an encoder CD which encodes it according to a variable length code and sends the encoded information, through a line 5, to a receiver or to a memory device, and, on the other side, to a local decoder for reconstructing the picture or pictures. The local decoder essentially comprises an inverse quantizer IQ and a circuit IT for computing the inverse transform. The output signal from IT is added in an adder AD with the predicted picture, stored in PR and suitably delayed in a delay element RT. The result is fed to PR for the new prediction. PR also receives from SM all information necessary for prediction and motion compensation. In turn, the predicted picture is also fed to SM to be used as reference picture. Line 4 schematises the whole of the connections which allow such an exchange of information between SM and PR.

The circuit of the invention may be used to perform the tasks of any one of blocks SM1–SM3. A single circuit can perform the tasks of one of such blocks or, in case some algorithmic measure is adopted, the tasks of block SM3 in addition to those of block SM2 (or block SM1, if block SM2 is dispensed with).

Figure 2:
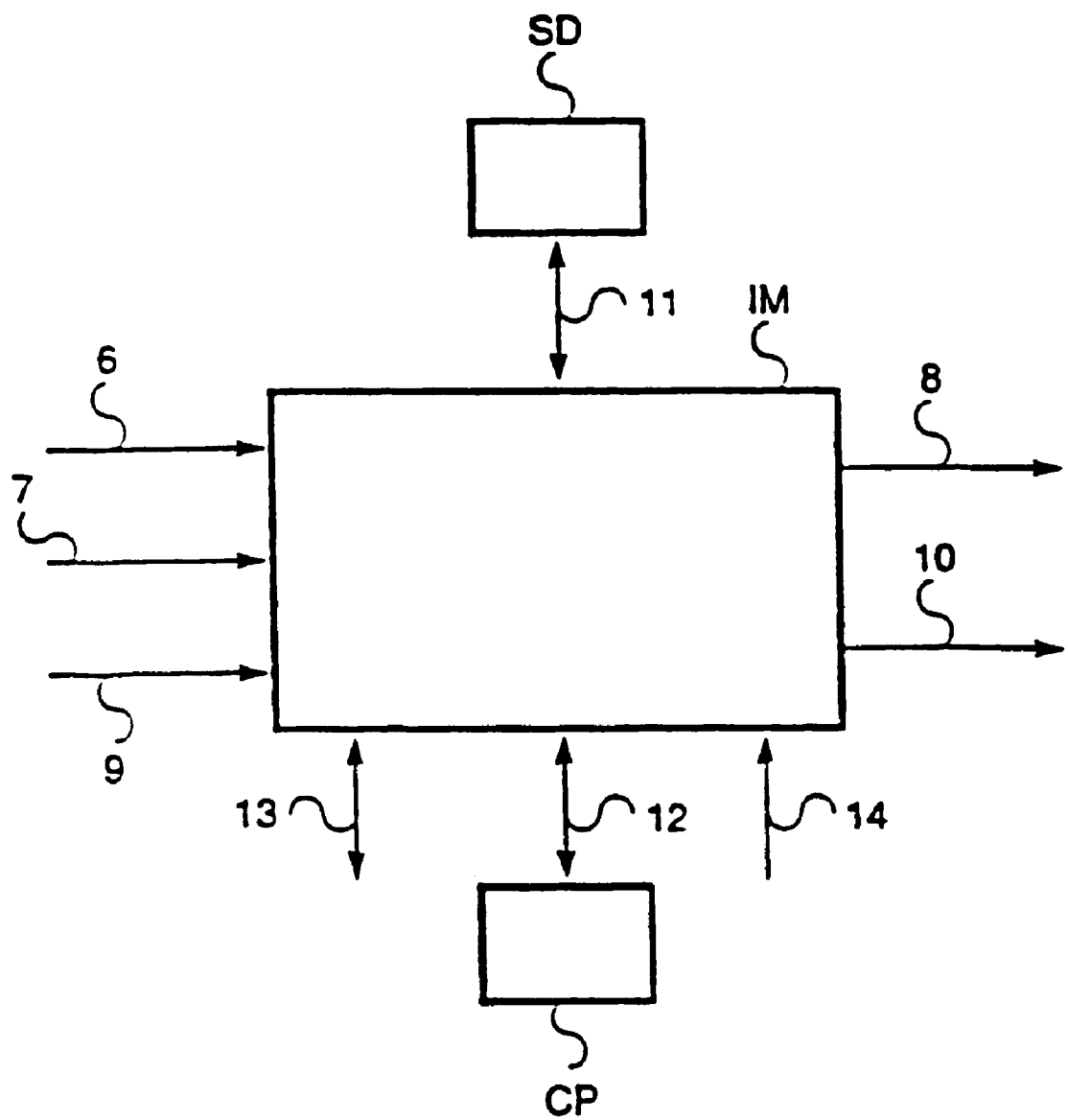
FIG. 2 is a diagram depicting the inputs and the outputs of the circuit according to the invention, when made as a single chip.

FIG. 2 shows that the circuit according to the invention, when it comprises a single integrated circuit component (chip) IM, presents the following inputs and outputs:

two input connections or buses 6, 7 and an output connection or bus 8 for the video data;

an input connection or bus 9 and an output connection or bus 10 for information required for the processing (hereinafter referred to as processing parameters) and processing results (vectors and associated costs);

a bidirectional connection or bus 11 for connection with an external memory SD;

a bidirectional connection or bus 12 for information and control signals coming from or directed to an external controller CP;

a bidirectional connection or bus 13 for signals relating to a self-testing of the circuit;

a further group of inputs, shown in the whole at 14, supplying IM with the is conventional clock, enabling and reset signals.

Buses 6–10, which substantially correspond to connections 1, 3, 4 in FIG. 1, convey also synchronism signals relating to the video data or concerning parameter extraction. By way of example, where necessary reference will be made to a clock frequency of 18 MHz on buses 6–10, and to a frequency of 54 MHz for reading/writing in SD. Such a frequency for data transfer to and from SD is a good compromise between speed and memory costs. The main synchronism signals of interest for an understanding of the invention are the picture synchronism signal (whose period depends on the number of macro-blocks in the picture) and the macro-block synchronism signal (whose period is 420 pulses of the 18 MHz clock signal). The synchronism signals also include valid-data signals.

The input/output buses for the video data will be hereinafter referred to also as 'picture buses', and the input/output buses for the processing parameters and the processing results will be hereinafter referred to also as 'information buses'.

Picture bus 6 supplies IM with the pixels of the pictures to be processed, whatever the application of the circuit. In case of vector determination one or more of those pictures act(s) also as reference picture(s). Picture bus 7 is used when the circuit operates for vector refinement and supplies IM with the pixels of the reference picture(s). Output picture bus 8 conveys the video data to subsequent units in the encoder. Video data on buses 6–8 are advantageously organised so that, for luminance, the 16 pixels of a row of the macro-block are read before moving on to the next row, whereas, for chrominance, pixel pairs Cb, Cr are read in sequence. The video data arriving at or to be emitted by IM are temporarily stored in SD.

Processing parameters are supplied through input information bus 9 or by controller CP. The parameters concerning type of encoding and picture structure are to be presented at picture rate, the other ones at macro-block rate. In case IM performs the functions of SM1 (FIG. 1), all information required might be provided by controller CP, in which case the input information bus is not used. When IM performs the functions of SM2 and/or SM3, it will receive the parameters concerning the type of encoding and the picture structure, the vectors provided by upstream circuit SM1 (or SM2) and some cost information through input information bus 9. The weights are supplied by CP. In the alternative the information varying at picture rate may be provided by CP also in case of vector refinement and prediction selection.

Depending on the picture structure, in the exemplary embodiment described here, IM is capable of calculating seven vector/cost pairs for each macro-block in case of frame pictures (namely one for frame prediction, four for field prediction—that is, one per each possible combination of two fields—and two for dual prime prediction) and 8 vector/cost pairs in case of field pictures (namely one per field for field prediction, four for 16×8 prediction—that is, one per each possible combination of two half-fields—and two for dual prime prediction).

Memory SD is advantageously an SDRAM (Synchronous Dynamic RAM) memory, which stores the reference image(s), the incoming data to be processed and the processing results (i. e. the vectors and the associated costs) before they are forwarded to the downstream units. The way in which memory SD is organised is not a subject matter of the present invention. However, to make the description clearer, some details about an exemplary organisation are given later on, with reference to FIGS. 14 and 15.

External controller CP provides IM with all information required for circuit initialisation, in the starting-up phase, during normal operation, it provides (or may provide) IM with the parameters required at picture rate, including the weight matrix for vector refinement if such matrix changes at picture rate.

Figure 3:
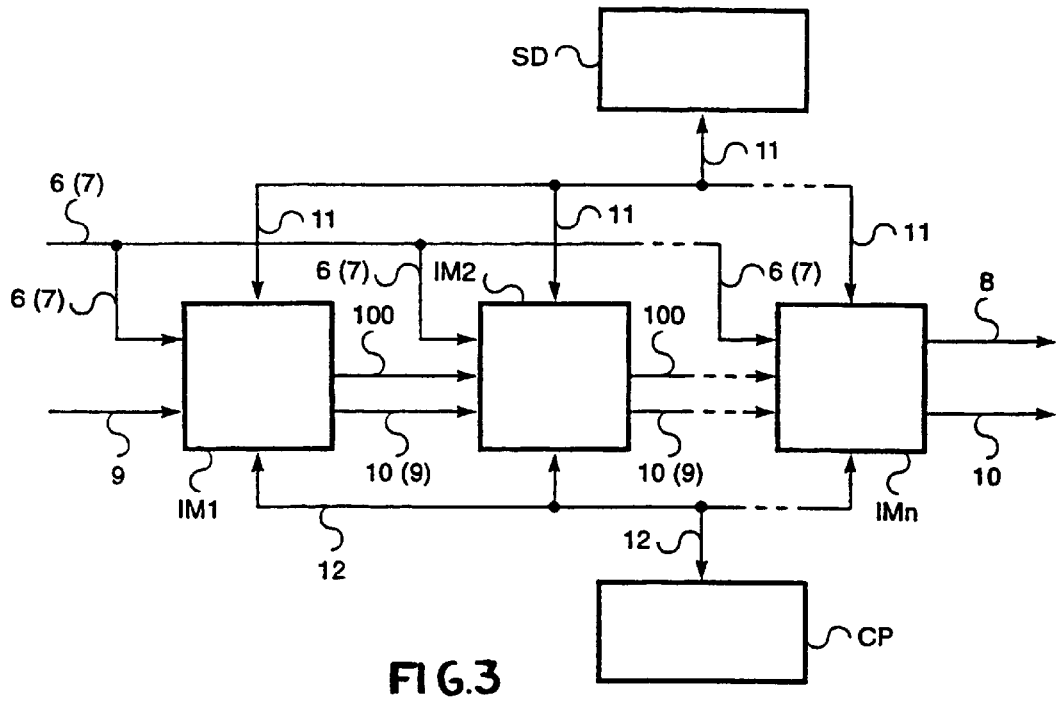
FIG. 3 is a block diagram of a multiple-chip circuit.

As shown in FIG. 3, a plurality of chips IM1 ... IMn like IM can be connected together in a chain structure for obtaining a higher processing power. Each chain however is intended to operate like the single chip IM in FIG. 2, that is, it can perform only one of the functions indicated above possibly jointly with prediction selection. Two cascaded chains like that shown in FIG. 3 have to be provided to perform both candidate vector determination and vector refinement. Mixed solutions are also possible, where a single chip performs one of the functions and a multiple-chip structure performs the other function. For candidate vector determination, a multiple-chip configuration allows expanding the size of the search area or to increase the number of matchings per macro-block. For vector refinement, the size of the zone can be increased. Chips IM1 ... IMn are connected to a same external controller CP and to the same picture buses 6, 7. They may share a same memory SD, as shown in the drawing, and in such case all chips must work onto the same search window, since the bandwidth available in memory bus 11 is entirely exploited. If operation on different search windows by different chips is requested (as it may be necessary in case of bidirectional prediction, since forward and backward predictions require different reference pictures) then the circuits in the chain must be associated with a respective memory. Each chip feeds the subsequent one with the intermediate processing results either directly, e. g. via information bus 10 or preferably via a dedicated line 100, or through the external memory SD, if it is shared by all chips.

The last chip in the chain, IMn, emits video data, parameters and vectors/errors on output picture and information buses 8, 10.

Figure 4:
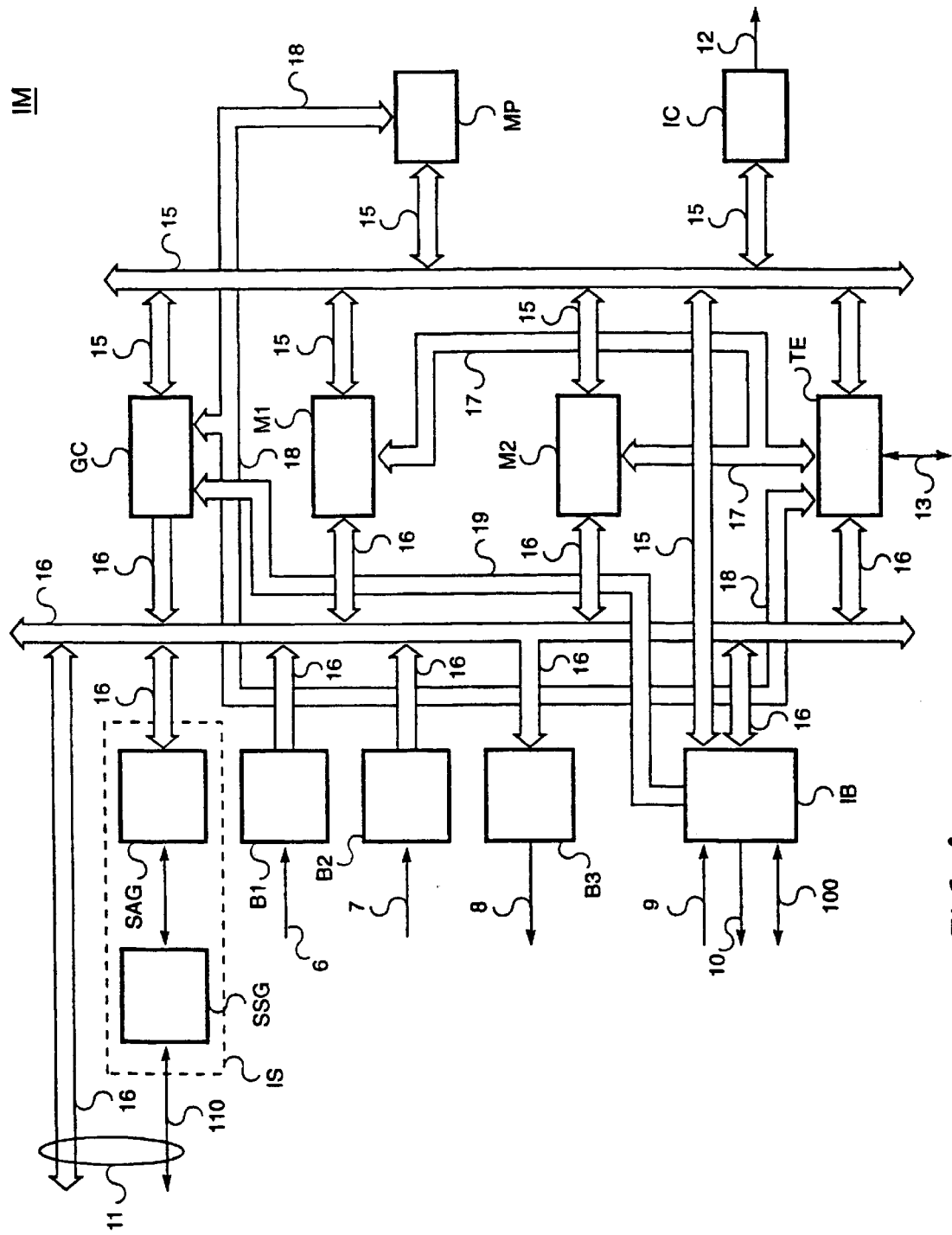
FIG. 4 is a general block diagram of the invention.

FIG. 4 shows the general block diagram of circuit IM. The essential components of the circuit are the operating units (modules) M1, M2 which execute the search algorithm for computing the candidate motion vectors or refining the candidate vectors computed by a similar circuit and/or execute the operations necessary for selecting the prediction strategy, as the case may be. In the embodiment shown, two modules M1, M2 are used. The presence of two modules represents a reasonable trade off between performance on the one side, and chip area and production cost on the other side and, moreover, allows meeting the real-time operation requirements. Actually, a substantial portion of a macro-block period is taken by the data transfer from SD to IM so that a second macro-block period is to be allotted to the processing of each macro-block: by using two modules, every two macro-block periods the motion/prediction information for two macro-blocks are generated. Modules M1, M2 are based on a mixed hardware-software approach, in which a dedicated hardware is used for calculating the costs of the vectors from the pixel information and a RISC (Reduced Instruction Set Computer) processor, controlling the dedicated hardware, is programmed to calculate the candidate motion vectors. The modules contain internal memories for storing the search window (which may also be asymmetrically located with respect to the current macro-block) and the current macro-block. The two modules are used so as to concurrently and independently process two different macro-blocks and circuit IM thus constitutes a MIMD (Multiple Instruction, Multiple Data) structure, in that each module may behave in different ways (Multiple Instructions) on different pixels (Multiple Data). At the end of the processing for a macro-block the best vectors and the relevant costs for different prediction modes are sent to external memory SD.

In the preferred embodiment of the invention, as far as candidate vector determination is concerned, the modules perform the genetic algorithm disclosed in the above mentioned paper and their structure is optimised to this application. For a better understanding, the main steps of the algorithm are summarised here:

Initialisation: a first set of N vectors or chromosomes (initial population) is generated; the set comprises: a group of vectors (up to 9 in the example reported in the paper) which are the vectors associated to as many macro-blocks surrounding the current macro-block in the reference picture previously received and represent the temporal correlation; the motion vector of the previous macro-block (considered in spatial sense, that is the macro-block that has been coded just before the current one, if the two macro-blocks belong to a same row, or the first macro-block of the previous row at the beginning of a new row), which represents spatial correlation; a group of further vectors obtained by adding random vectors to each of the previously mentioned vectors. The initial population may also comprise a further vector (guide vector), provided through information bus 9; the guide vector too is representative of the correlations existing in the picture or among pictures and serves to facilitate retrieval of the best matching macro-block.

Evaluation: each vector is evaluated by using the mean absolute difference as cost function;

Selection: vectors are ordered and a subset (e. g. the 9 best vectors) is stored in the module for use for computing further vector generations (iteration);

Iteration: it is performed e. g. in three steps; at each step, the vectors of the subset retained at the end of the previous step are combined by computing their half vector sum and a group of son vectors (e. g. ten) is obtained: the population in the current generation is completed by adding a random vector to each son vector; the vectors are evaluated as before.

Finish: the best vectors for each prediction type and the associated costs are stored in SD, together with the best candidate vector for the prediction concerning the whole macro-block (to be used in the processing of the subsequent macro-block).

In case of vector refinement, as said, modules M1, M2 are programmed to perform an exhaustive search of the best-matching macro-block within a zone by weighting each candidate vector by a suitable weight.

Figure 5:
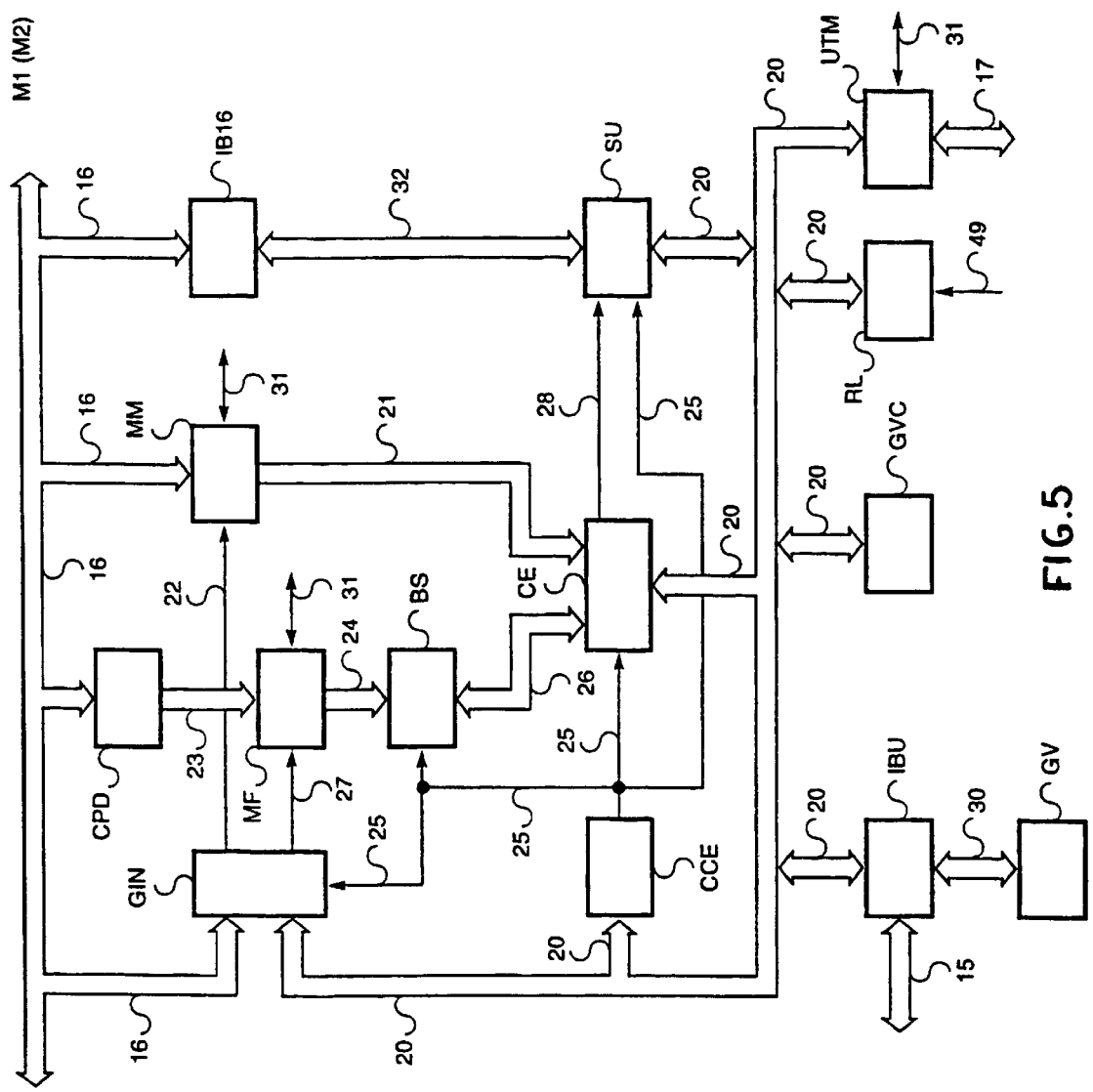
Figure 6:
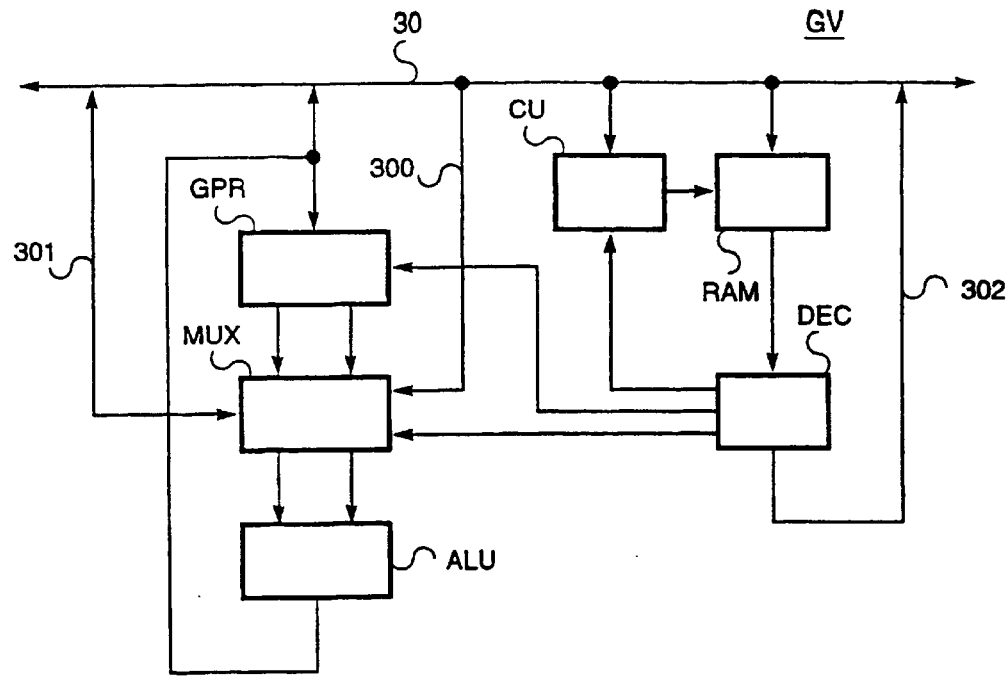
Figure 7:
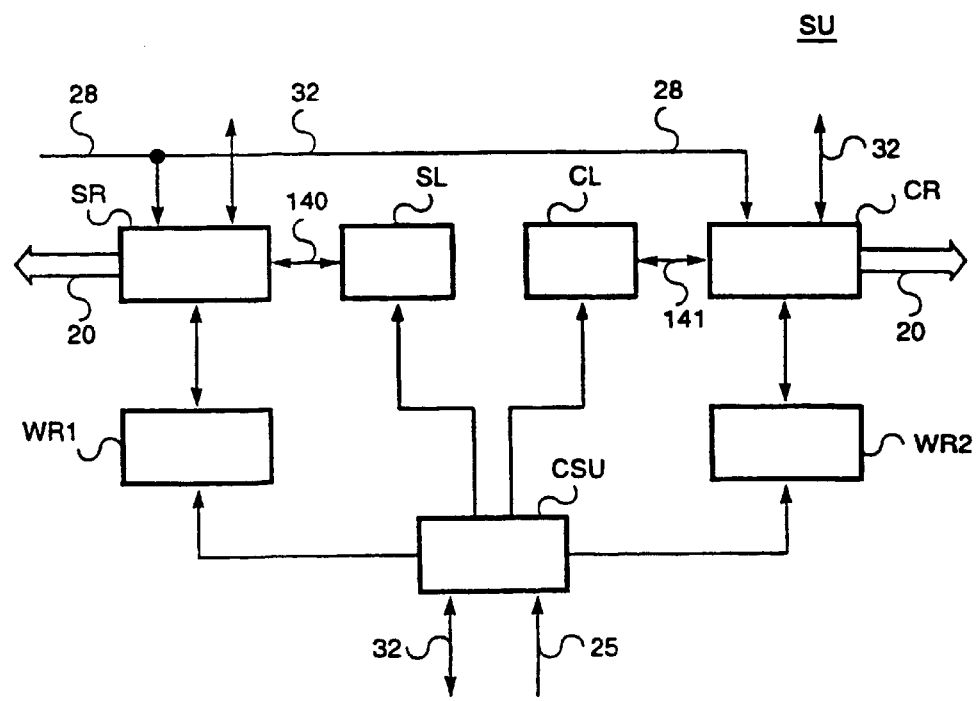

The structure of modules M1, M2 will be disclosed in more detail with reference to FIGS. 5 to 7.

Modules M1, M2 are connected to two internal buses 15, 16.

Bus 15 serves for exchange of information with external controller CP and for exchange of information between the modules themselves and other units in the circuit (in particular, for access of the modules to an internal memory MP, discussed below). Information exchange with external controller CP is controlled through an interface IC which allows CP to access IM for initialising the configuration registers and loading the necessary programs in the starting phase, for writing the processing parameters and the weight matrix during normal operation, as well as for monitoring the state of IM. IC includes an arbitrating unit arbitrating access of modules M1, M2 and of controller CP to bus 15 in such a manner that the modules obtain access in mutually exclusive way and CP may always interrupt the operations of M1, M2, for monitoring and debugging. Devices performing the tasks of interface IC are well known in the art.

Bus 16 conveys the data to be written into or read from the external memory SD. It is connected on the one side to the input/output ports of modules M1, M2 intended for loading into the modules the pixels belonging to the search window and to the current macro-block and for emitting the vector/cost pairs, and on the other side to buffers B1–B3 for the temporary storage of video data coming from buses 6, 7 and to be forwarded onto bus 8 and for the conversion of data parallelism between the formats used on the picture buses (for instance, 8 bits) and on bus 16 (for instance, 16 bits). Buffers B1–B3 are conventionally divided into two sections working in a ping-pong way.

Bus 16 is further connected to information buses 9, 10 through an information bus manager IB which is to manage the transfer of information coming from and directed to such buses. Said information can be:

exchanged between the units in IM through bus 16;

broadcast to other units in IM in static way;

exchanged between the internal units of IB and external memory SD;

read/written by external controller CP through bus 15 (internal registers can be read for test and diagnosis purposes while processing parameters can be supplied by CP, as already stated);

exchanged among different chips IMi of the circuit in the multiple-chip configuration.

In case of a circuit belonging to a multiple-chip configuration in which the transfer of the intermediate processing results takes place through a dedicated line 100, the latter is connected to information bus manager IB.

Figure 8:
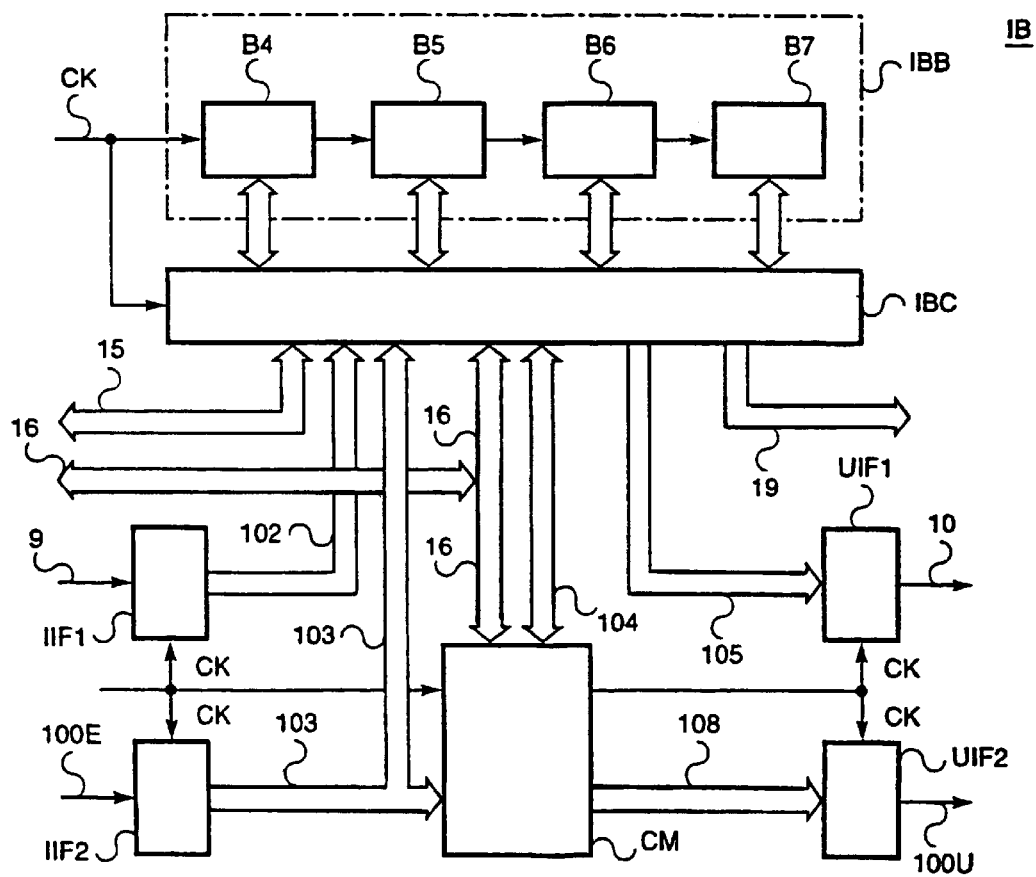
FIGS. 5 to 9 are block diagrams of some units in the circuit of FIG. 4.

The structure of 1B will be disclosed in greater details with reference to FIG. 8.

Data transfer over bus 16 is controlled by a microprogrammed control unit GC (global or internal controller), in co-operation with a memory interface IS. Control unit GC has substantially to:

control the global flow of operations in the circuit;

generate and distribute the general timing synchronisation to the circuit blocks;

synchronise the internal circuit activity with external synchronisation;

initiate all data transfers (hereinafter referred to as 'transactions') on bus 16;

initiate the operations of the module.

Control unit GC is also responsive to parameters, in particular processing parameters varying at picture rate, arriving at the circuit through information bus 9 and forwarded to GC through IB and a further internal bus 19.

GC essentially comprises a group of counters and a microprogrammed sequencer. Based on the instructions in the sequencer memory, GC will address two (or more) units which have to transfer data, by identifying the source and destination interfaces and sometimes the size of a block of data to be transferred and its position. GC only manages transfers of data and never calculates internal addresses for the units. The structure of GC will be disclosed in further details with reference to FIG. 9. A schedule of the transactions will be disclosed with reference to FIGS. 10 to 12.

Interface IS controls through a hardware structure the actual access to memory SD (FIG. 2) for data transfer, once controller GC has identified the units interested in the transfer, by generating all necessary addressing and control signals. Interface IS comprises two blocks SAG, SSG, of which the first generates the addresses for accessing SD for reading/writing data blocks whose size can be communicated by GC for each operation or for refreshing the memory, whilst the second one generates the actual reading and writing commands in individual memory locations, starting from the information received from SAG. Such commands are presented on a connection 110, conveying also signals related to data transfer management sent back by SD. IS is transparent to the data (both pixels and processing results), which pass directly from IM to SD and vice-versa through bus 16. Thus, line 11 of FIGS. 2 and 3 actually comprises connection 110 and the proper wires of bus 16. Interface IS acts as master unit in the transfer process, while the other unit(s) is (are) the slave unit(s). The structure of SAG and SSG will be disclosed in further details with reference to FIGS. 16 to 20.

The circuit further comprises the internal memory MP and a testing unit TE.

Memory MP is a conventional random access memory storing the weight matrix which is provided by CP when IM performs vector refinement. Memory MP could also been used as ancillary memory by the modules M1, M2.

Testing unit TE is a so-called JTAG (Joint Test Action Group) interface compliant with standard IEEE1149.1. Testing unit TE is connected via bus 13 to a conventional test controller (not shown) and has the following standard inputs: TMS (JTAG Test Mode Selection), TCK (Test Clock for JTAG Interface), TDI (JTAG Test Data In), TRST (JTAG Test Reset) and a standard output TDO (JTAG Test Data Out). Unit TE is extended as described below with reference to FIG. 13 (where the above mentioned inputs/outputs are shown) to allow the control of all built-in self-test features of the circuit. To this end, TE has access via buses 15, 16 to all resources connected to said buses; moreover, it has direct access to modules M1, M2 (via a bus 17) and to memory MP and the memories in GC (via a bus 18) for controlling self test functions in such memories and receiving test status information and test results.

Referring now to FIG. 5, module Mi (i=1, 2) essentially comprises:

vector generation unit GV, which is to calculate the motion vectors depending on the circuit function and the algorithm chosen, and to control the other units in the module;

a first and a second memory MM, MF respectively storing the current macro-block and the search window extracted from the reference picture (the previous I or P picture in case of a frame picture, or the two previous I or P fields for each field, in case of a field picture);

an address generation unit GIN, which is to generate the read and write addresses for MF and MM by exploiting the vectors supplied by GV and control signals supplied through bus 16;

a pixel processor or matching engine CE which is to perform the arithmetical operations on the pixels required for determining the costs associated with the vectors or the different prediction types, depending on the function the circuit is to perform. CE is associated with a controller CCE (substantially, a bank of registers) which receives from GV information about the kind of operation CE is to perform in a given operation phase and the motion vectors, which according to the MPEG2 standard also include operating information;

a sorting and classification unit SU, which, during the processing relevant to a macro-block, receives the vectors and the corresponding costs from CE and is: to sort the vectors according to an error rank for a given type of error and to keep available the best vectors (i. e. those associated with the lowest errors, for instance the nine best vectors); to classify the vector/error pairs according to the prediction type and to store the best vector for each prediction type to be used as candidate vector for that type of prediction; to make available the stored vector/error pairs to the external memory or to the other circuit units for use in processing of a subsequent macro-block in case of candidate vector determination (the nine best vector/error pairs), or for refinement (the candidate vectors for each type of prediction) and to receive from the external memory vector/error pairs previously computed, to be made available to GV, the structure of SU will be better disclosed with reference to FIG. 7;

an interface IB16 connecting SU to bus 16 and intended to perform the necessary format conversion between the formats used in SU and on bus 16 and a temporary storage the data to be transferred from bus 16 to SU and vice versa to match the modalities of reading/writing in the external memory (typically by bursts, i. e. groups of words) and the need of properly addressing the memory locations in SU;

a generator GVC of random vectors required by the genetic algorithm;

a bank of local registers RL for storing control information, provided by controller GC (FIG. 4) e. g. through bus 15, necessary to start and synchronise the operations of the module, as well as information, such as the module state, to be made available to the outside;

a memory testing unit UTM which is to test memories MF, MM as well as an internal memory in GV, in co-operation with testing unit TE (FIG. 4)

The module comprises an internal bus 20 to which units CE, CCE, SU, GVC, RL, UTM are directly connected and which, through an interface IBU, allows connection of said units either to bus 15 or to vector generation unit GV, which is connected to IBU through a bus 30. IBU allows also connection of vector generation unit GV to bus 15. Thus IBU will comprise, besides the suitable units performing the necessary format conversions, a switching network that sets the connection required by the particular operation phase. The proper connection is set by GV, in case of operations controlled by GV itself (generally speaking, writing into or reading from module registers) or by the external controller interface IC (FIG. 4) when a unit in the module is to access bus 15.

Memory MM obviously is to store the 16×16 pixels of the current macro-block.

It comprises two units operating in ping-pong, each arranged to store of 128 16-bit words (i. e. 128 pixel pairs). Each write operation concerns two pixels at a time and each read operation concerns 8 pixels at a time. The pixels read from MM are presented on a bus 21. To allow a proper operation with the matrix geometry entailed by such an arrangement, memory MM is preferably made as a register file. Control and address signals for MM are provided by GIN through a connection 22.

Memory MF is arranged to store, for the candidate vector determination, a search window that, in the embodiment of the invention described here by way of non limiting example, has a size of 96×64 pixels (6×4 macro-blocks); for vector refinement, MF stores a zone having a size corresponding e. g. to 4 macro-blocks. Memory MF is composed of six memory units each having a storage capacity of 16×64 pixels (i. e. a vertical stripe of 4 macro-blocks) organised e. g. in 128 words of 64 bits each (i. e. each word comprises the data of 8 pixels). Each unit advantageously comprises two elements each intended to store 128 words of 32 bits since, as known to the skilled in the art, the overall area of said two elements is smaller than that occupied by a single element with the overall storage capacity required of the unit itself. Address and control signals for MF are supplied by GIN through a connection 27.

The six units in MF are organised in different manner depending on whether they belong to a circuit performing the candidate vector determination or to a circuit performing vector refinement.

In candidate vector determination, the whole of the capacity of memory MF is required to store the search window and the six units are individually accessed both in writing and in reading. Writing exploits the fact that the search windows for adjacent macro-blocks differ by a vertical stripe of 4 macro-blocks, so that at each macro-block cycle only such stripe is to be written into MF, thereby updating one unit. As to reading, the genetic algorithm used in the preferred embodiment requires comparison of the current macro-block with reference macro-blocks that are substantially randomly chosen, and thus access to random points in the search window must be possible.

In vector refinement, where only the zone is to be stored, the six units form two memory banks operating in ping-pong. In this case however the zones to be used in processing adjacent macro-blocks may have any relative position and hence at any new macro-block cycle the whole data of the zone are to be loaded into MF. Each zone is indeed made of two portions each associated with one of the two fields of the reference picture (for the frame picture) or with one of the reference fields for the field picture. Given the zone size, also in vector refinement each write operation into MF updates one of the units. Reading will take place with the modalities required by an exhaustive search in the search area concerned (typically, 20×20 pixels).

The individual units in MF receive the data through an input bus 23 (operating e. g. with 32-bit parallelism) which is connected to bus 16 through a 16-to-32 bit data parallelism converter CPD. The data read from MF are presented on an output bus 24 operating with 192 bit parallelism (i. e. 24 pixels at a time are read). This ensures that 17 adjacent pixels (an entire macro-block row plus a further pixel required for half-pixel interpolation and dual prime prediction) are actually read at each clock cycle. The 17 pixels simultaneously read will be referred to as 'group'. Output bus 24 of MF leads to a barrel shifter BS which chooses, according to suitable control signals provided by control unit CCE through a connection 25, the 17 adjacent pixels of interest within the string of 24 pixels read from MF and presents the pixels chosen on a bus 26 leading to CE. Block CCE generates the control signals by exploiting the least significant bits of the motion vectors supplied by GV and configuration information coming from the global controller GC (FIG. 4). Circuits performing the tasks of BS are well known in the art.

Address generation unit GIN, in writing mode, addresses units MM, MF by co-operating with the external memory interface IS (FIG. 4) through bus 16. Writing into MF during candidate vector determination takes into account that the six elements are updated cyclically, as said before, so that there is a cyclical shift of the origin of the search window. In reading, GIN computes the addresses for MF starting from the values of the x and y component of a vector supplied by GV. GIN may cause simultaneously reading of both memories, or reading of only one of them, depending on the particular operation performed. Information regarding the mode of operation is assumed to be provided by CCE, through connection 25.

Vector generation unit GV is based on a pipelined RISC architecture capable of executing one instruction per clock cycle. Depending on the program stored, GV may implement any desired algorithm for vector determination, vector refinement, prediction selection or test. As far as vector determination and refinement and prediction selection are concerned, unit GV must be able to process two type of data: vectors (requiring separate processing of the two components at each instruction) and errors (requiring processing of the whole data item). To this end it includes a register file with a number of registers (e. g. 16) each dedicated to a vector and an error; the register organisation is such that a single logical address is associated to a vector and an error, even if the register physically contains two sections storing vectors or errors, respectively. Selection of a vector or an error for processing is obtained by a proper coding of the instructions.

GV uses five groups of instructions, namely: arithmetic and logic instructions; test instructions; branch and jump instructions; external access instructions; synchronisation instructions. The set of instructions is loaded into GV in an initialisation phase, through bus 15 and interface IBU. Through local registers RL, vector generation unit GV receives suitable control signals from global controller GC (FIG. 4). In this respect it is to be appreciated that the global controller may cause execution of different portions of the program in different moments of an operating cycle. The arithmetic instructions allow performing additions, subtractions, logic combinations, comparisons and shifts; the latter serve for performing divisions and multiplications without the need for an actual multiplier. For operation on errors, also determination of maxima and minima are possible.

Concerning the synchronisation instructions, they include a 'wait on' instruction for synchronising GV with the other units in the module.

The architecture of GV is substantially the standard architecture of such kinds of units and needs not to be described in detail. However, for a better understanding, it has been schematically shown in FIG. 6, where:

RAM denotes the conventional instruction memory, written through buses 15 and 30 by the external controller and provided with its built-in self test capability;

CU denotes the whole of the control units (program counter, RAM control, branching unit . . . ), addressed through bus 30;

DEC includes the instruction decoder and pipeline control, generating the control and addressing signals for the different blocks in GV as well as the external addresses;

GPR is the register file, organised as described above and having a data input connected to bus 30 or to the output of an arithmetical-logic unit ALU, and two data outputs; the two data outputs are separate, from the operational point of view, only in respect of vectors;

MUX includes the multiplexers selecting the different types of inputs for ALU, as well as pipeline and forwarding units; MUX may receive data from the decoder (immediate data), from the local registers (connection 300) and from external units (connection 301), and forward data to external units (always through connection 301); connections 300 to 302 are part of bus 30;

the arithmetical-logic unit ALU, which either performs two independent operations, on the two vector components, or a single operation on an error.

Pixel processor CE is arranged to calculate the mean absolute error between a current macro-block and a reference macro-block, by comparing homologous pixels in pixel groups concurrently processed and provided by BS and MM through buses 26, 21. In case the circuit performs prediction selection, CE is to calculate also the cost associated with the intra-picture encoding. The error calculation is performed over an entire macro-block (16-line error) and its two halves (8-line error), so that three errors for each macro-block are generated. The three errors allow evaluating costs for all type of predictions admitted by MPEG2 standard, as it is clear for the skilled in the art. The errors are supplied to sorting unit SU through a connection 28, together with the respective vector provided by CCE. The basic error calculation requires a clock cycle (at 54 MHz) for each pixel row in the macro-block. The circuit can calculate the errors for integer pixels, or with a half pixel precision, by effecting the interpolation between adjacent pixels in a row (horizontal interpolation) and/or in adjacent rows (vertical or diagonal interpolation), and to this end a further clock cycle is required. The error may be computed with or without d. c. component removal from the processed pixels. The value of the d. c. component is also computed by CE. D. c. removal is required for a good performance of the two-dimensional transform required by the standard. The type of operation to be performed in CE is indicated by control signals provided by CCE through connection 25.

CE thus is to compute:

a) three error values having the general expression:

$$MAE = \frac{\sum_{j=1}^{N}\sum_{i=1}^{16} |(P_{SW}(i,j) - DC_{SW}) - (P_{MC}(i,j) - DC_{MC})|}{N \times 16} \quad (1)$$

where $P_{SW}(i,j)$ is the i-th pixel (possibly submitted to interpolation) in the j-th row in the reference macro-block (or macro-block half) considered in the search window, $P_{MC}(i,j)$ is the i-th pixel in the j-th row of the current macro-block, N is 16 or 8 depending on whether the error concerns an entire macro-block or half a macro-block; and $DC_{SW}$, $DC_{MC}$ are the d. c. component of the reference or respectively the current macro-block (relevant to the entire macro-block or to half a macro-block), given by the general expression:

$$DC = \frac{\sum_{j=1}^{N}\sum_{i=1}^{16} |P(i,j)|}{N \times 16} \quad (2)$$

where P is the pixel of the current or the reference macro-block, as the case may be.

b) during prediction selection, the intra-picture cost given by $$IPC = \frac{\sum_{i,j=1}^{16} |P_{MC}(i,j) - DC_{MC}|}{256} \quad (3)$$

Obviously DC is different from 0 only if d. c. removal is required.

CE essentially consists in a pipelined arithmetic unit where the pipeline stages may be enabled differently depending on the particular calculation CE is to perform at a given instant. Depending on the operation phase, on the operation mode and the function of the circuit, CE performs the following operations:

1) interpolation (if required) on the pixels belonging to a group or to consecutive groups in the reference macro-block, on a pixel by pixel basis; more in detail, indicating by A(k) the k-th current pixel (k=0 . . . 15) and by B(k) the corresponding previous pixel, one of the following pixels is calculated:

$Q_1(k) \equiv A(k)$   integer pixel $Q_2(k) \equiv \dfrac{A(k)+B(k+1)+1}{2}$   dual prime integer or vertical interpolation $Q_3(k) \equiv \dfrac{A(k)+A(k+1)+1}{2}$   horizontal interpolation $Q_4(k) \equiv \dfrac{Q_2(k)+Q_2(k+1)}{2}$   diagonal interpolation $Q_5(k) \equiv \dfrac{Q_2(k)+Q_{2'}(k+1)}{2}$   dual prime and vertical interpolation $Q_6(k) \equiv \dfrac{Q_5(k)+Q_5(k+1)}{2}$   dual prime and diagonal interpolation Addend '+1' in the expression of $Q_2$ and $Q_3$ represents a rounding off of the pixel value, required by the standard; term $Q_2'(k)$ in the expression of $Q_5$ is pixel $Q_2(k)$ relevant to the previous row concerned by interpolation;

2a) in case of error computation with d. c. removal: computation of the d. c. component for a row of the current and the reference macro-block, on a pixel by pixel basis; accumulation of the components relevant to 16 or 8 rows and averaging of the accumulated values;

2b) error computation for a row, accumulation over 16 or 8 rows and averaging of the accumulated result.

Furthermore, in case of prediction selection, the following operations are performed:

3) intra-picture cost calculation with d. c. removal for a row of the current macro-block; accumulation of the costs of the 16 rows and averaging of the accumulated result;

4) evaluation of the cost for an encoding with frame or field discrete cosine transform, in case of a picture to be submitted to intra-picture encoding.

Given the above mathematical relations, the skilled in the art has no problem in designing an arithmetic unit capable of performing the described operations.

Random vector generator GVC is based on the use of linear feedback shift registers and is arranged to supply a pseudo-Gaussian distribution of random numbers for each component of a vector. The desired distribution is obtained by performing inversions and multiplications on a basic set of random numbers. The variance in both directions of the distribution can be adjusted by vector generation unit GV or by the external controller. GVC provides GV with a vector when receiving a request by GV; the request starts generation of a new vector. The design of a generator of that kind is not a problem for the skilled in the art, once the particular distribution is known.

Memory testing unit UTM is a unit intended to co-operate with the built-in self-test features in the memories of the modules. UTM is connected on the one side to bus 17 for receiving test control signals from and sending test results and status information to TE (FIG. 4). On the other side UTM is connected to MF, MM through a connection or bus 31 through which UTM addresses a specific memory element concerned by the test, sends test data to the element and receives test results therefrom, and to bus 20 for access to RAM (FIG. 6)

FIG. 7 shows a functional scheme of sorting and classification unit SU. SU has to be accessed, in different operation phases, by: external memory SD, which is to load into SU the initialisation vector/error pairs for GV and is to receive from SU the best vector/error pairs at the end of the processing of macro-block; vector generation unit GV, which is to read the vector/error pairs supplied by the external memory; pixel processor CE, which is to write the vector/error pairs to be sorted and classified. SU is functionally divided into two parts, of which the first is intended to perform the sorting of the vectors (taking into account to this end only a specific error, e. g. the 16-line error) during candidate vector determination, and the second is intended to perform the association of the vector/error pairs with the type of prediction for vector refinement and selection prediction and to store the best vector/error pair for each type of error.

The first part comprises a bank of registers SR (e. g. nine in the exemplary embodiment of the genetic algorithm performed in the module), and a sorting logic SL which performs the comparisons necessary for sorting. Registers SR may be written by CE (connection 28), read from GV (through bus 20) and written/read by the external memory (connection 32 towards IB16). During processing, a newly received vector/error pair is stored into the proper register of the bank whenever the cost is lower than that of the worst vector stored up to that moment. This requires a transfer of the vector/error pairs from SR to SL and vice versa, as schematised by connection 140. Block WR1 schematises a conventional unit controlling writing into or reading from the proper register by the external memory or by GV, CE and SL, as the case may be. Unit WR1 is in turn controlled by a control logic CSU, which receives the necessary mode information e. g. from CCE (connection 25) and which also controls the operation of sorting logic SL and drives interface IB16 (connection 32).

The second part of SU also comprises a bank of registers CR, each associated with an error type and storing the best vector for such type, and a classification logic CL which performs the comparisons necessary for identifying the best error and addressing the proper register. For instance, two registers are required for the field prediction of the field picture based on same parity and odd parity reference field, respectively; other four registers are associated on the contrary with the predictions on eight lines, where the upper or lower half of the macro-block may be considered. Similarly to SR, CR receives the vector/error pairs through connection 28, and it may be written/read by external memory through connection 32 and may be read by GV through bus 20; moreover it exchanges, through connection 141, the vector/error pairs with classification logic CL which performs the necessary comparisons. Block WR2 has the same tasks as WR1 and is similarly controlled by CSU, which in turn also controls CL.

The module operation will now be summarised.

Considering candidate vector determination for a given macro-block in steady-state condition (i. e. when a reference picture is already available), the current macro-block and the relevant search window (more particularly, the portion differing from the stored window for the previous macro-block) are read from the external memory and loaded into memories MM and MF. Moreover, the vector/error pairs required for initialisation of the vector population are read from the external memory and transferred to GV sthrough registers SR in sorting unit SU. GV then starts generating the vector population by using also the random vectors provided by GVC, as disclosed above.

During each iteration step of the genetic algorithm the vectors are sequentially fed to the matching engine controller CCE for properly setting the matching engine CE, and to address generator GIN for reading from MF the macro-blocks identified by said vectors. CE performs the error calculations and, at the end of each iteration step, the best vectors (9 in the example described) are kept within vector generation unit for use in building the subsequent generation. The error calculations are repeated for the vectors of each new generation. When all generations have been taken into account, the nine vectors exhibiting the best 16-line errors are stored into registers SR of the sorting unit, while the best vector for each kind of error is stored in registers CR. The best vector in SR is also transferred to external memory SD (FIG. 2) for being used in the initialisation phase relevant to the subsequent frame and is kept available for use by GV for the subsequent macro-block. Also the vectors in CR are transferred to the external memory whence they will be read in the order required for output on bus 10. In effect, the two modules concurrently process two macro-blocks belonging to a same column in the picture, whereas the vectors are to be outputted on bus 10 sequentially, row by row. It is also to be appreciated that, in case of a circuit belonging to a multiple-chip structure like that shown in FIG. 3, vector transfer from SU to the external memory only concerns the last chip in the chain, whereas the vectors computed in the other chips are transferred to interface IB (FIG. 1) of the subsequent chip.

When the circuit is used for vector refinement, a zone is loaded into MF instead of a larger search window as required for candidate vector determination. Vector generation unit GV and pixel processor CE use the candidate vectors (identified and classified by CR and CL) which are retrieved from the external memory. Vector refinement requires weighting of the candidate vectors with weights stored in memory MP (FIG. 1) and arriving at GV through bus 15 and interface IBU. GV will generate the vectors as required by an exhaustive search within the search area in the zone and, for each new vector, CE will calculate the 16-line and 8-line errors as before, updating CR when necessary. At the end of the processing, vectors/errors pairs may be directly transferred onto bus 10 (FIG. 2), through IB16, bus 16 and IB (FIG. 5).

Lastly, for prediction selection, the module exploits the set of candidate vectors retained at the end of the vector refinement and the relevant errors to perform the operations required by the particular program stored in GV and to recognise whether the best prediction mode for the picture is a forward, a backward or a bidirectional prediction; moreover, it calculates the intra-picture encoding cost IPC, as discussed above, and compares it with an error MAE associated with the best prediction mode identified. Intra-picture encoding will generally be chosen when MAE exceeds IPC by more than a given threshold value. A further step in prediction selection is the choice of the manner in which the bi-dimensional transform is to be computed. In this respect, it is to be reminded that the transform may be computed on a frame or a field basis: the decision is of relevance in case of intra-picture encoding, whereas in the case of prediction the choice is linked with the type of prediction selected.

Referring to FIG. 8, information bus manager IB essentially comprises:

first input and output interfaces IIF1 and UIF1 respectively connected to buses 9 and 10 for data parallelism conversion between the formats used on the information buses (for instance, 4 bits) and on bus 16 and for data synchronisation;

a buffer IBB for temporary storage of the information passing through IB;

a control unit IBC;

a comparison logic CM;

second input and output interfaces IIF2, UIF2 which, in case a dedicate line 100 is used to transfer the intermediate processing results between chips in the multiple-chip configuration, interface CM with input and output branches 100E, 100U of that line, respectively.

Buffer IBB is a single port SRAM (Synchronous Random Access Memory) which is divided into four independent banks B4–B7 each storing e. g. 128 words of 16 bits each. It operates in a ping-pong way, according to two different behaviours for candidate vector determination and vector refinement.

For candidate vector determination, the four banks act as two distinct sections. Each section is composed of two banks that work in a ping-pong way. One section is always used to store the information (discussed below) necessary in order control unit IBC generates a skeleton information bus, with the inclusion of the candidate motion vectors and costs. The other section manages motion vectors and costs.

For vector refinement, three banks are used for the transmission of motion vectors and costs inside circuit IM, between SD, modules M1, M2, comparison logic CM and buffer IBB itself, and the fourth bank is used to store data incoming through interface IIF1 before sending them to UIF1. The latter task is sequentially transferred from one of banks B4 . . . B7 to a subsequent one at macro-block frequency, and reading from a bank starts after writing in the other three, thus providing for a 4-macro-block period delay between reading data from input information bus 9 and writing data onto output information bus 10.

Control unit IBC has essentially the following tasks:

to address buffer IBB by using different laws for the different information; addressing takes place according to macro-block rate synchronism that is provided by global controller GC;

to extract picture rate data from information bus 9 and make them available to other units inside IB itself and inside IM (in particular to GC, FIG. 4, through bus 19);

to create the skeleton information bus, by using the configuration flags, picture rate data, the macro-block addresses and synchronism signals that are provided by global controller GC through bus 15 and the candidate motion vectors and the related costs in candidate vector determination;

to supply motion vectors and costs for the pipeline processing in the multiple-chip configuration;

to cope with read and write operations through bus 15.

Control unit IBC is connected to input interfaces IIF1, IIF2. to comparison logic CM and to output interface UIF1 through internal buses 102, 103, 104, 105. It is also connected to bus 16.

Comparison logic CM is enabled, in the multiple-chip configuration of the circuit, to compare the costs of the vectors calculated by modules M1, M2 in the chip with the costs of the vectors calculated in the previous chip in the chain and it propagates to the downstream chips the vectors with the lower costs. It has two sets of registers, of which the first set is used to store the locally processed motion vectors and costs (e. g. 6 vector/cost pairs), whereas the second set is a buffer for the results of the distributed pipeline processing (e. g. 12 vector/cost pairs). CM receives and emits the vector/cost pairs through interfaces IIF2, UIF2 (connected to CM through buses 103,108 respectively) or it may receive them from modules M1, M2 (FIG. 4) through bus 16 and write vectors and costs directly in SD, always through bus 16.

The various units inside IB also receive suitable synchronism signals, generally indicated by CK and including the clock signals at 54 MHz, supplied to all units, and at 18 MHz, supplied to the interfaces and to comparison logic CM, as well as the synchronism signals associated to the information bus (picture and macro-block synchronism and valid data signals). Macro-block synchronism and valid data signals are also associated by IB to output information bus 10.

The flow of operations involving IB and its parts can be summarised as follows:
  initial motion vectors (candidate or guide vectors) and costs might be stored in buffer IBB and are then transferred to the registers of modules M1, M2 before the processing starts;
  when vector processing ends, motion vectors and costs are propagated between chips (in multiple-chip configurations) using output information bus 10 or dedicated link 100, and locally compared in comparison logic CM. In general, during the same time interval, many chips work on motion vectors (the same or different vectors, depending on the particular multiple-chip configuration) belonging to the same processed macro-block, thus exploiting a distributed pipeline processing;
  the last chip of a multiple-chip configuration stores the results of the processing into SD or directly into buffer IBB, depending on whether or not a delay exists between the end of processing and the data output; in the former case, after a time period corresponding to that delay, data will be extracted from SD and stored again in buffer IBB.

Figure 9:
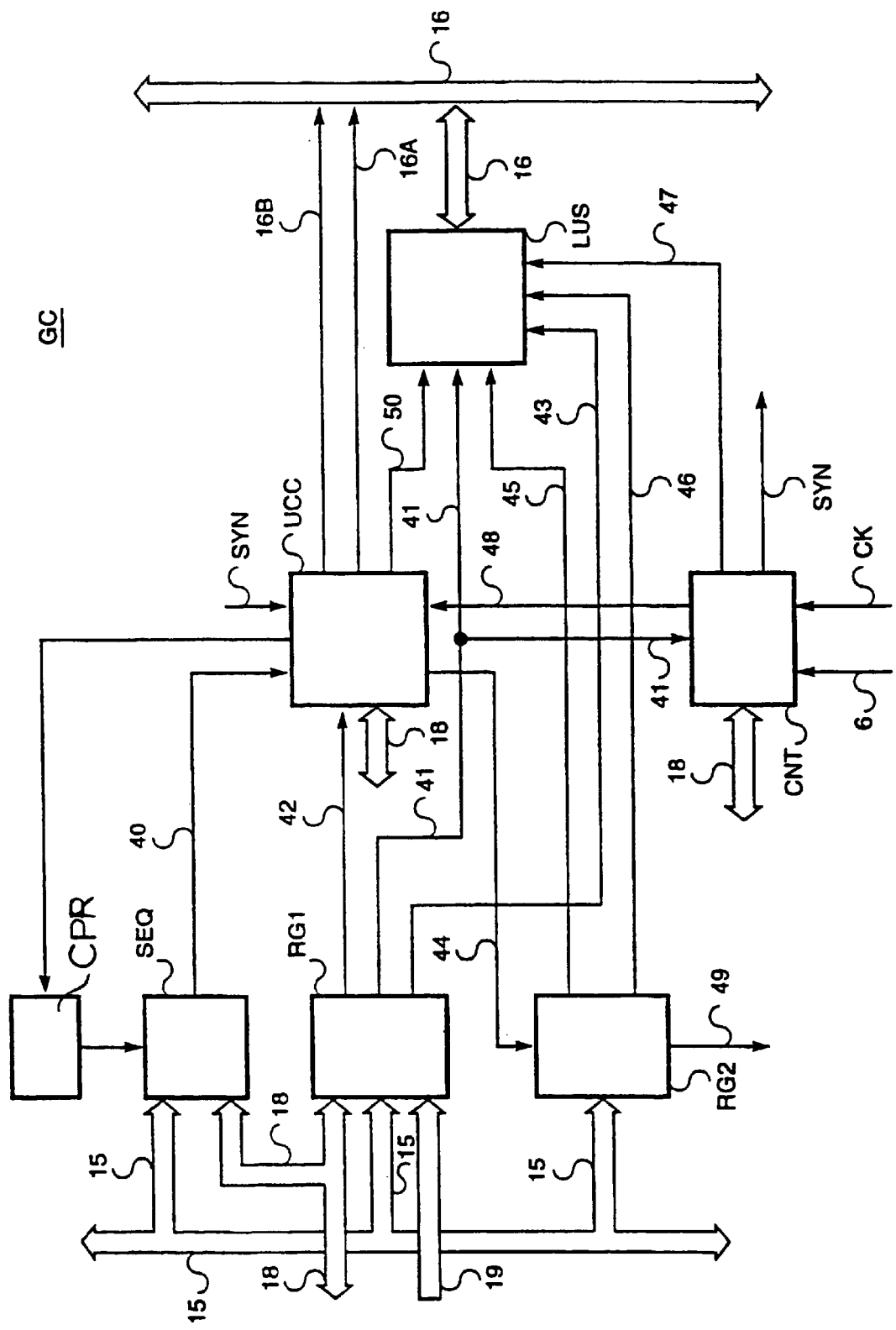

Referring now to FIG. 9, global controller GC essentially comprises: a micro-instruction sequencer SEQ controlled by a program counter CPR which sequentially controls the micro-instruction execution; two sets of registers RG1, RG2; a group of counters CNT; an output logic network LUS; and a control unit UCC.

Micro-instruction sequencer SEQ stores a set of instructions provided by external controller CP through bus 15 in an initialisation phase of the circuit. The instructions essentially concern pixel or vector transfer over bus 16 or transfer of operating parameters into and between internal registers of the global controller itself. Each instruction contains an operation code defining the operation GC is to start, as well as synchronisation information defining the time allotted to the execution of the instruction itself. The instructions are sent through a connection 40 to control logic UCC which will decode them and consequently will start the proper operation. Synchronisation information is used by control logic UCC to make program counter CPR advance sequencer SEQ at the end of the instruction. Instructions concerning transfer of parameters into or between internal registers also contain information from which control logic UCC may extract the writing and reading addresses for the registers.

The first set of register RG1 includes configuration registers, which are allotted to permanently valid parameters and are initialised by external controller CP (FIG. 2) through bus 15, as well as registers storing information varying at macro-block rate and registers storing information varying at picture rate; the information for the latter two groups of registers may arrive from IB (FIG. 4), through bus 19, or from external controller CP or vector generation unit GV (FIG. 5) through bus 15. Since the external memory generally stores multiple pictures, the registers for information varying at picture rate comprise multiple elements each associated with one of the pictures. The contents of the configuration registers and of those allotted to information varying at picture rate can be used i. a. for setting the counters in CNT and for influencing the operation of output logic LUS, and are transferred to CNT and LUS through a connection 41. One of the configuration registers also is arranged to receive from the external controller a flag indicating that initialisation is over (and hence the controller is ready to operate) and to transfer it to control unit UCC as start signal (connection 42). Another register may receive from TE (FIG. 4), through bus 18, a test flag setting the controller in a test mode. The parameters varying at macro-block rate are typically used by LUS to build output parameters and are sent to LUS through a connection 43.

The second set of registers RG2 comprises the internal registers of the controller which may be concerned by the parameter transfer mentioned above. Such registers are addressed by UCC through connection 44, starting from information contained in the instructions coming from SEQ. Some of the registers may be accessed also by other units of the circuit through bus 15. Among the information provided by or intended to said other units we mention status information relevant to the activation of vector generation unit GV (FIG. 5), which is supplied to local registers RL trough connection 49, and parameters to be sent to output logic network LUS in order to influence its operation or to be used by LUS to build output parameters. Lines 45, 46 schematise the connections conveying said parameters to LUS.

Counters CNT are to: control, in a manner programmable by configuration registers in RG1, the start of the data processing and output operations; generate the picture, macro-block and pixel synchronism signals (indicated in the whole by output SYN) for timing the operation of the different units in the circuit; and activate the different units in the circuit at the proper instants, again in a manner programmable by configuration registers in RG1. To perform their tasks, counters CNT lock themselves to the picture synchronism signal associated with the incoming data on bus 6 (or with the incoming parameters on bus 9) and receive the suitable clock signals CK (e. g. at 18 or 54 MHz, in the preferred embodiment of the invention). One of the counters is to count the time dedicated to the execution of the individual micro-instructions and to emit time-out signals to UCC (connection 48) in order it can advance program counter CPR.

Output logic network LUS substantially comprises a bank of multiplexers which are to build, starting from values supplied by the counter and/or from information stored in registers in RG1, RG2, some parameters governing the proper access to the external memory for pixel transfer over bus 16. The parameters are then sent to external memory interface IS (FIG. 4) through bus 16. The most important parameters indicate: the picture stored in the external memory and concerned by the transfer operation; the current macro-block position in that picture; the region position (region being a picture portion—e. g. the search window or a zone—which is concerned by a data transfer operation); and the region size. Clearly region position and macro-block position coincide if data transfer concerns a macro-block. Said parameters are emitted whatever the pixel transfer operation to be performed (e. g. reading from or writing into the external memory a macro-block. reading a search window or a zone), but they can be built in different manner depending on the type of operation and/or on special processing requirements. In particular, LUS may build the parameters starting from default data (which can be the values present on outputs 47 of the counters in case of macro-block position, values supplied by registers RG1 through connection 43 for the region position and fixed values for the region size, values provided by the registers for the picture) or by using values supplied by registers RG2 through connection 46. The selection of the proper sources of data is controlled by the information about the type of operation (OP_CODE) provided by control logic UCC through wires 50 and by signals provided by registers in RG1, RG2 through connections 41, 45. The latter signals will generally cause selection by LUS of the special values stored in registers RG2.

Control logic UCC essentially comprises a decoding logic network, which decodes the instructions generated by SEQ, and a sequential logic (state machine) which is to start the general operation of controller GC, upon receipt of the start flag mentioned above, and to control the evolution of the microprogram stored in the sequencer. UCC receives also the proper synchronism signals SYN from the counters and, during the execution of an instruction, emits on wires 16B of bus 16 a signal (ADR_VAL) enabling the concerned unit(s) connected to bus 16 to perform the operation identified by information OP_CODE presented on wires 16A. Information OP_CODE is to be sent to LUS through connection 50 in advance with respect to that provided on bus 16, that is why two separate connections have been shown. OP_CODE may be either the operation code contained in the instruction, or a code indicating that no operation is to be performed or yet a code indicating that a refresh of the external memory is to be performed. The latter codes are generated by the sequential logic in UCC. The 'no operation' code is generated by UCC when a particular transaction indicated in the instruction is not enabled: enabling of the individual transactions is internally handled by UCC by taking into account the general situation of the circuit (available in the sequential logic) and the values provided by counters CNT. The 'external memory refresh' code generally will be generated in situations when no data transfer can be enabled, independently of the content of the instruction: for instance, refresh may take place in correspondence with an instruction requesting output of the so-called 'stripe blanking'.

Counters CNT, sequencer SEQ and control logic UCC are also connected to bus 18 for testing by TE (FIG. 4).

Figure 10:
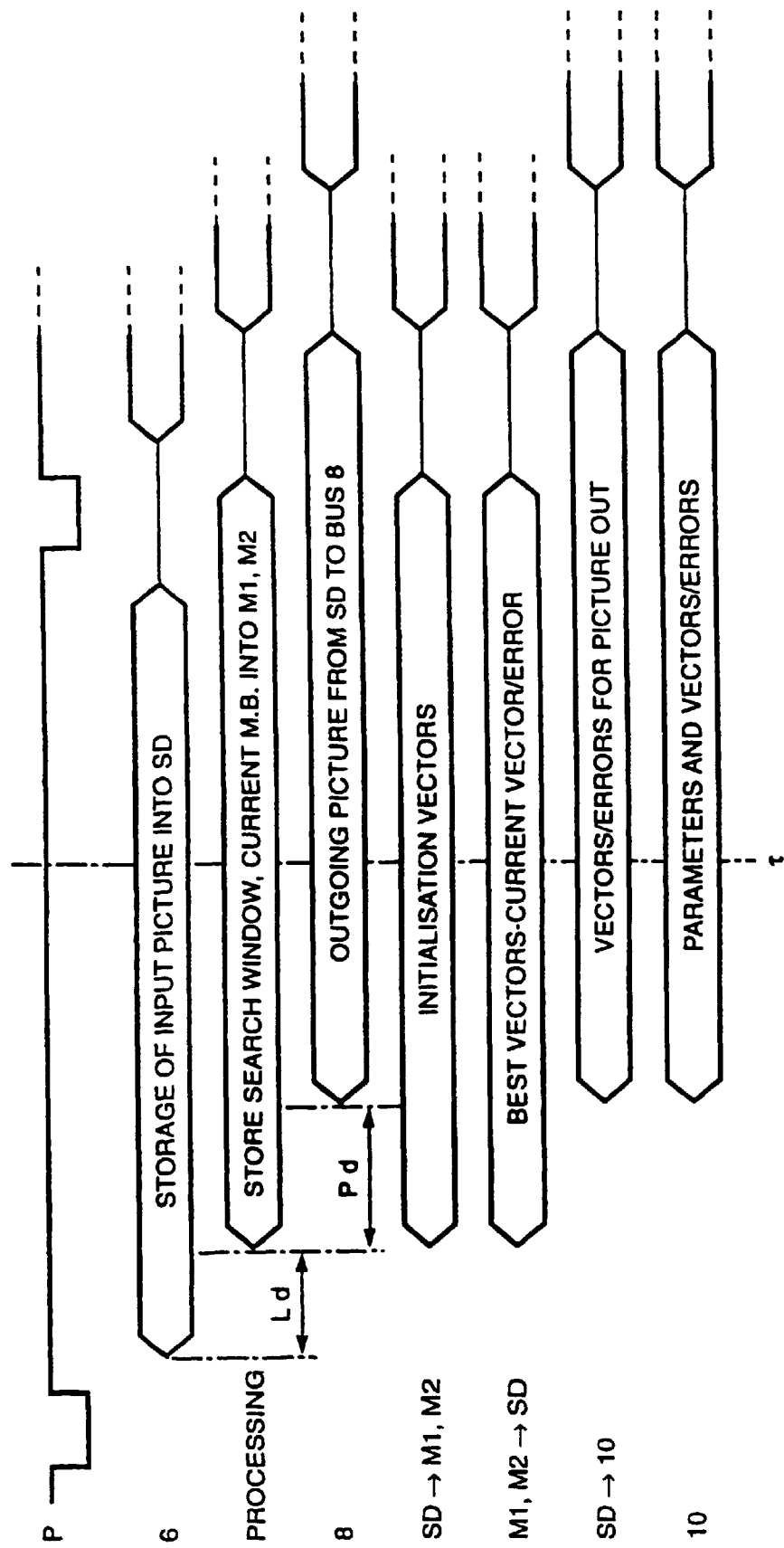
FIGS. 10 to 12 are time diagrams of the data transfer in the circuit of FIG. 4.
Figure 11:
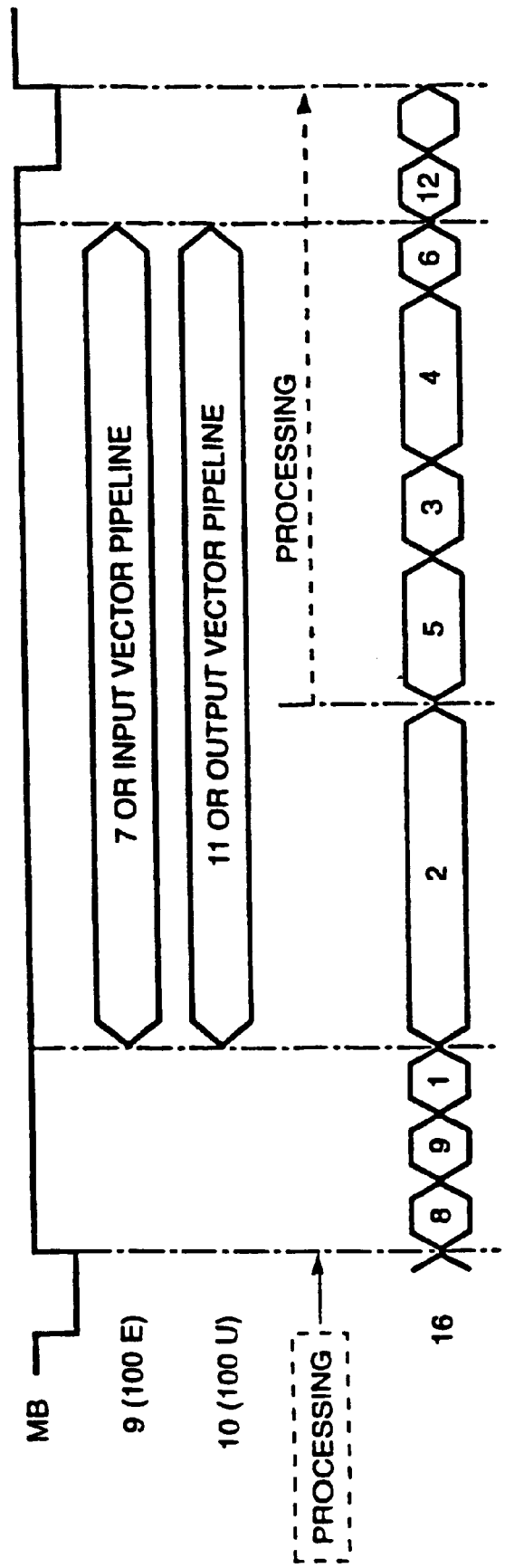
Figure 12:
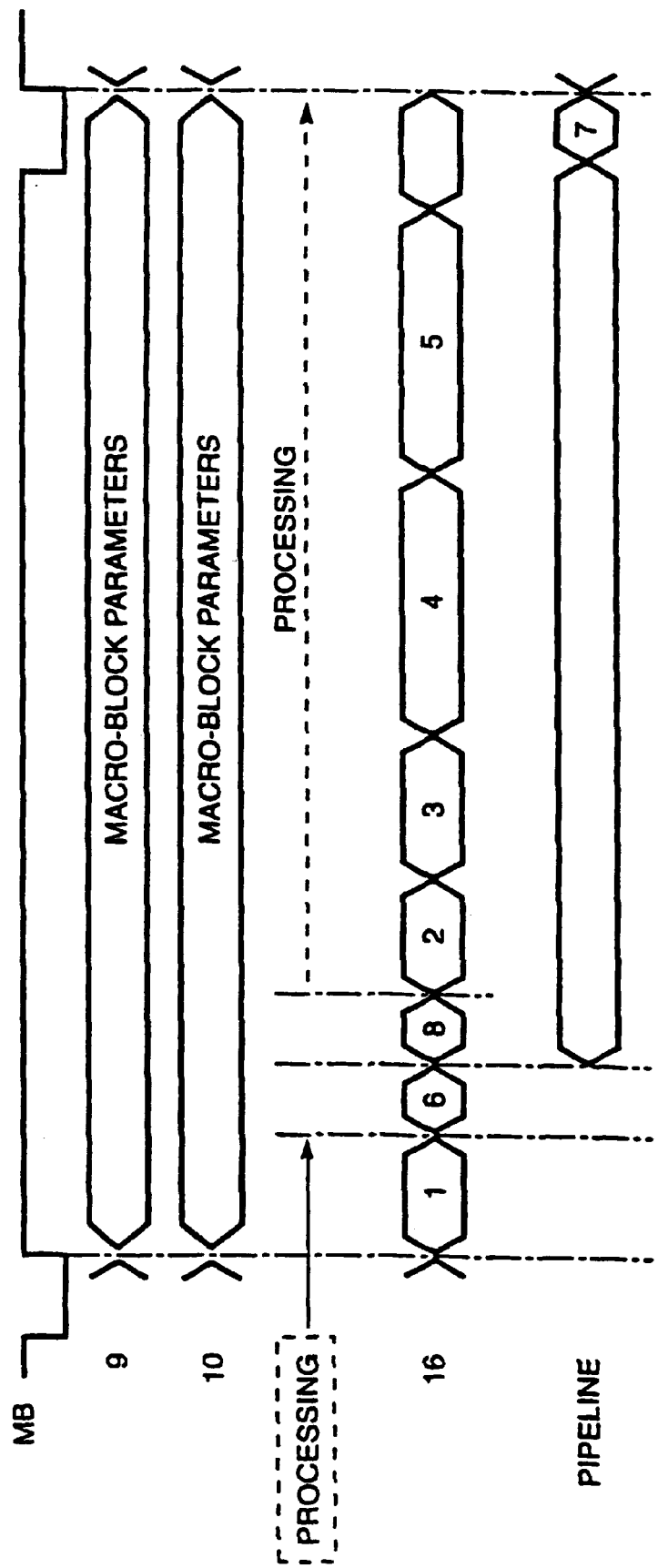

For a better understanding of the controller operation, reference can be made to FIGS. 10 to 12 which disclose the processing evolution and the transaction sequence during a picture period (FIG. 10) and during a macro-block period, for candidate vector determination and vector refinement, respectively (FIGS. 11 and 12).

Referring to FIG. 10, the top line shows the picture synchronism signal P; the six subsequent lines concern pixel management (first three lines) and vector/error management (the other three); the last line refers to the output of the processing parameters and processing results. The lines denoted 6, 8 and 10 refer to the operations on the homonymous buses. During the active periods of the picture synchronism signal, an input picture arriving through bus 6 (FIG. 2) is loaded into SD. After a latency time Ld (which typically is 2 macro-block stripes for candidate vector determination and 1 macro-block period for vector refinement) the processing of data starts and the search window and the current macro-block are transferred to modules M1, M2 (more particularly, to memories MF, MM, FIG. 5). At the end of a processing delay Pd (which typically is 3 macro-blocks for vector refinement and ranges from 2 to 47 macro-blocks—i. e. 2 macro-blocks plus one stripe—for candidate vector determination), the picture is sent from SD onto output picture bus 8. Simultaneously with the start of pixel processing, modules M1, M2 start reading the initialisation vectors from SD, to perform the proper search algorithm and to send the best vector/error pairs to SD. At the end of the processing, the vectors stored in SD are transferred to output information bus in synchronism with the pixels and with the processing parameters.

FIGS. 11 and 12 refer to the operations concerning a macro-block at an instant like instant T in FIG. 7, for candidate vector determination and vector refinement, respectively. The top line shows the macro-block synchronism signal, and lines denoted 9, 10, 100, 16 refer to operations involving the homonymous buses. The Figures also indicate as the processing evolves. In particular, it can be seen that the processing might not begin immediately at the start of the macro-block period, to allow acquisition of results of the processing carried out in the previous macro-block period. Then, once the processing is started, it occupies the remaining part of the macro-block period and the whole of the subsequent macro-block period in candidate vector determination, whereas in vector refinement it extends over the whole of the subsequent macro-block period and an initial fraction of yet another macro-block period, even if in the whole the processing is slightly shorter than two macro-block periods.

For candidate vector determination the transaction sequence may be as follows:

transferring the best vector computed during the previous macro-block period-from one of the modules M1, M2 (FIG. 4) to SD_(FIG. 2) (transaction 8 in the drawing);

transferring the vector/error pairs retained in the module to comparison logic CM (FIG. 8) (transaction 9); this operation is carried out in the multiple-chip configuration;

transferring the initialisation vectors from SD to the module (transaction 1)

transferring four vertical macro-blocks of the search window from SD to memory MF (FIG. 5) in the module (transaction 2); simultaneously with such operation, in case of multiple-chip configuration, the loading into buffer IBB (FIG. 8) and the transfer from buffer IBB to comparison logic CM of the vector/error pairs supplied by the previous chip in the chain (transaction 7) or the pipeline operation of the different chips in a multiple-chip configuration are started;

transferring luminance and chrominance pixels of a macro-block from SD to output buffer B3 (FIG. 4) (transaction 5); the actual processing starts at the beginning of this transaction;

transferring the current macro-block (only luminance pixels) from SD to memory MM (FIG. 5) in the module (transaction 3);

transferring a macro-block (luminance and chrominance pixels) from input buffer B1 (FIG. 4) into SD (transaction 4);

transferring vector/error pairs from SD to buffer IBB (transaction 6); the end of this operation coincides with the end of the time dedicated to the transfer of vectors from the input information bus to the circuit and from the circuit to the output information bus, or to the pipeline processing;

transferring vector/error pairs from CM to SD in case of multiple-chip configuration (transaction 12).

For vector refinement (FIG. 12), transfer of processing parameters from input information bus 9 (FIG. 2) to IM or from IM to output information bus 10 demands substantially the whole macro-block time. The operation sequence might be:

transferring luminance and chrominance pixels from input picture bus 6 to SD and transferring the current macro-block (luminance pixels only) from SD to memory MM (FIG. 5) in the module (transaction 1); during such operation, the processing of a macro-block started two macro-block periods before comes to end;

transferring a group of refined vectors from the module to comparison logic CM (FIG. 8) in case of multiple-chip structure (transaction 6);

transferring a group of candidate vectors from IBB to the module (transaction 8);

transferring the luminance pixels of the reference picture from input picture bus 7 (FIG. 2) to SD (transaction 2); simultaneously with the beginning of the operation, the processing and the pipeline operation in the multiple-chip configuration start;

transferring luminance and chrominance pixels of the macro-block from SD to output picture bus 8 (transaction 3);

transferring a first field of the zone from SD to memory MF (FIG. 5) in the module (transaction 4);

transferring a second field of the zone from SD to memory MF in the module (transaction 5);

In the time elapsing between the end of transaction 5 and the end of the macro-block period the pipeline processing ends and the refined vectors are transferred to IBB, FIG. 8 (transaction 7).

The individual operations are started by the above mentioned signals ADR_VAL and OP_CODE in the presence of the respective enabling signal generated in UCC (FIG. 9).

Figures 13, 14:
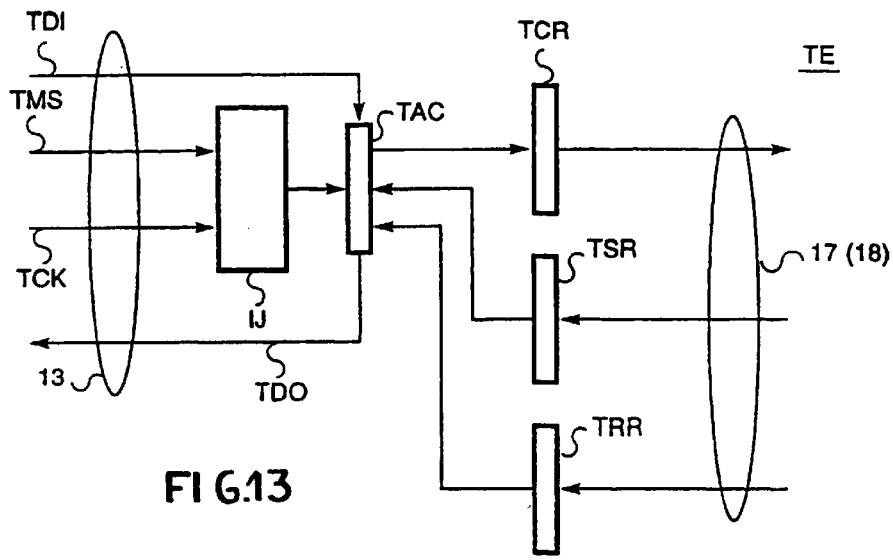
FIG. 13 is a block diagram of a testing unit.
FIGS. 14 and 15 are diagrams of the data organisation in an external memory associated with the circuit.

Obviously, during latency time and processing delay only some of the above operations are performed; the enabling signals for the remaining operations will not be generated and GC will instead emit the 'no operation' code Referring to FIG. 13, testing unit TE comprises: the standard JTAG interface IJ, including the conventional instruction register (containing according to the invention a special instruction RUNBIST) and instruction decoder; an extra data register TAC (Test Access Control Register) for internal bus access; a register TCR (Test Control Register) for internal test control; a register TRR (Test Result Register) for the test results read; and lastly a register TSR (Test Status Register) for the test status data.

RUNBIST instruction activates the self test and enables the outputs of register TCR via register TAC.

Register TAC provides two accesses. The first one is the access to registers TCR (write), TRR (read), TSR (read) to control the test and to evaluate the test results. The second one is the access to buses 15 and 16 to enable reading from or writing into all resources connected to those buses to allow an enhanced circuit debugging via the standard testing unit. For this second access type, register TAC can be loaded via interface IJ with an address, data and two control bits which indicate the bus to be selected (bus 15 or bus 16) and the access mode (read/write). TAC serially receives input test data TDI via bus 13 and send them in parallel to TCR; in the opposite direction, it receives in parallel status information and results from TCR and TSR and converts them into output serial test data TDO.

Each location in register TCR contains a bit enabling a particular self test function of the circuit, i. e. a memory built-in self test or a built-in self-test controlled by software by the RISC processors in the modules. Each location in register TRR contains a bit indicating the result of one particular test. Each location in register TSR contains a bit indicating the status (running/not running) of one particular self test. All locations in register TCR which contain bits that control self test functions in modules M1 and M2 (FIG. 4) are connected directly to the modules via bus 17. All results and status information from modules M1 and M2 are directly transferred to the corresponding locations in the registers TSR and TRR also via bus 17. All locations in register TCR which control built-in self-test functions of the memories in blocks GC and MP (FIG. 4) are directly connected to the corresponding memory built-in self-test modules via bus 18. All result and status outputs of the memory built-in self-test modules of said blocks are connected to the corresponding locations in registers TSR and TRR also via bus 18.

The structure and the operation of external memory interface IS (FIG. 4) will now be described in detail with reference to FIGS. 16 to 20. In the detailed diagrams, for the sake of drawing simplicity, a single connection line has been indicated for each block pair, although different output signals of a block can be routed to different circuits. Moreover, in bus 16, the wires entering and leaving SAG and the output have been separately shown by 16i, 16u respectively. Before describing the diagrams, the data organisation used in memory SD shall be shortly illustrated referring to FIGS. 14, 15.

Memory SD comprises a single chip having a capacity allowing it to store:

luminance and chrominance pixels Yi, Ci of three pictures (i=1, 2, 3);

motion vectors BVi (one per macro-block) used to initialise the genetic algorithm for processing the three pictures, each vector is represented by a horizontal component and a vertical component, each expressed by a 16-bit word; vectors BVi are assumed to be located between the luminance and the chrominance pixels;

luminance and chrominance pixels Yr, Cr of the reference picture used in the case of vector refinement;

motion vectors CV related to 6 macro-block stripes of a picture being processed (current vectors) and the errors associated thereto, also represented by 16-bit words.

The chip is organised into two banks A, B of 2048 rows each and, with respect to the pixels, each row stores two luminance macro-blocks or four chrominance macro-blocks. The macro-blocks are stored in frame format. The macro-blocks of a same horizontal stripe in a picture (see MB0, MB1, MB2 in FIG. 15) are written alternately into the two banks, one per row, and the macro-blocks of two subsequent stripes (e. g. MB0, MB45) are written in a same row in such a way that, regardless of the format of the picture to be stored, the entire frame is stored in a same row. It is clear that, if the macro-block to be written is of the field type, alternate memory locations will have to be addressed, in order to obtain the frame structure.

For vectors BVi, the vectors associated with macro-blocks of consecutive stripes (STR0, STR1 . . . ), will be written alternately into the two banks, and each row of a bank can store two stripes.

For the reference picture, luminance pixels Yr and chrominance pixels Cr of four macro-blocks are stored, with the same alternation between the banks seen previously.

For vectors CV, the operation of the circuit, for vector determination, require storing 12 vectors/errors per macro-block. Each row stores the vectors and the errors related to four macro-blocks.

Write operations in general concerns the data of or relevant to entire macro-blocks both for pixels and processing results, and such macro-blocks coincide in general with the macro-blocks in the picture. Thus holds true in particular for the vectors/errors, which are determined by IM at the macro-block level. However, as said, the circuit is capable of operating on picture portions whose size can be set at each operation, and hence pixel sets can be written whose size is different from the macro-block size or which do not coincide with a macro-block in the picture. As to reading, vector reading concerns vectors associated to one or more macro-blocks, which again coincide with the macro-blocks in the picture. In the case of pixels, the pixels of a single macro-block (generally displaced with respect to the macro-block grid in the picture), or a region of greater size than the macro-block can be read. Hereinafter the term "reading (or extracting) a macro-block" will be used when the pixel set to be read coincides with a macro-block of the picture, and the term "reading (or extracting) a region" in the opposite case. It should also be taken into account that in synchronous dynamic memories each operation concerns a certain number of blocks of words (bursts) of a certain length. In the invention, both the number and the length of the bursts can be determined during the addressing phase.

Figure 15:
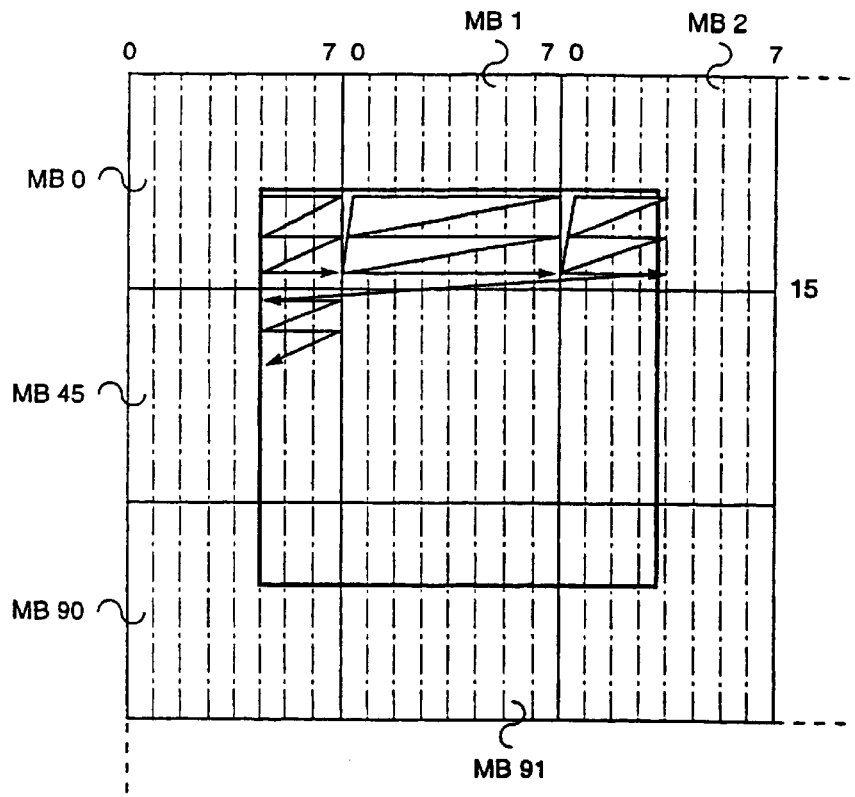

The reading scheme for the pixels, in the more general case, is as shown in FIG. 15, i. e. reading occurs macro-block by macro-block, stripe by stripe. Note that, with the data organisation disclosed, the macro-block change corresponds to a row change within SD (FIG. 2), whereas the passage from one pixel row to another within the same macro-block corresponds to a jump of a certain number of columns.

Figure 16:
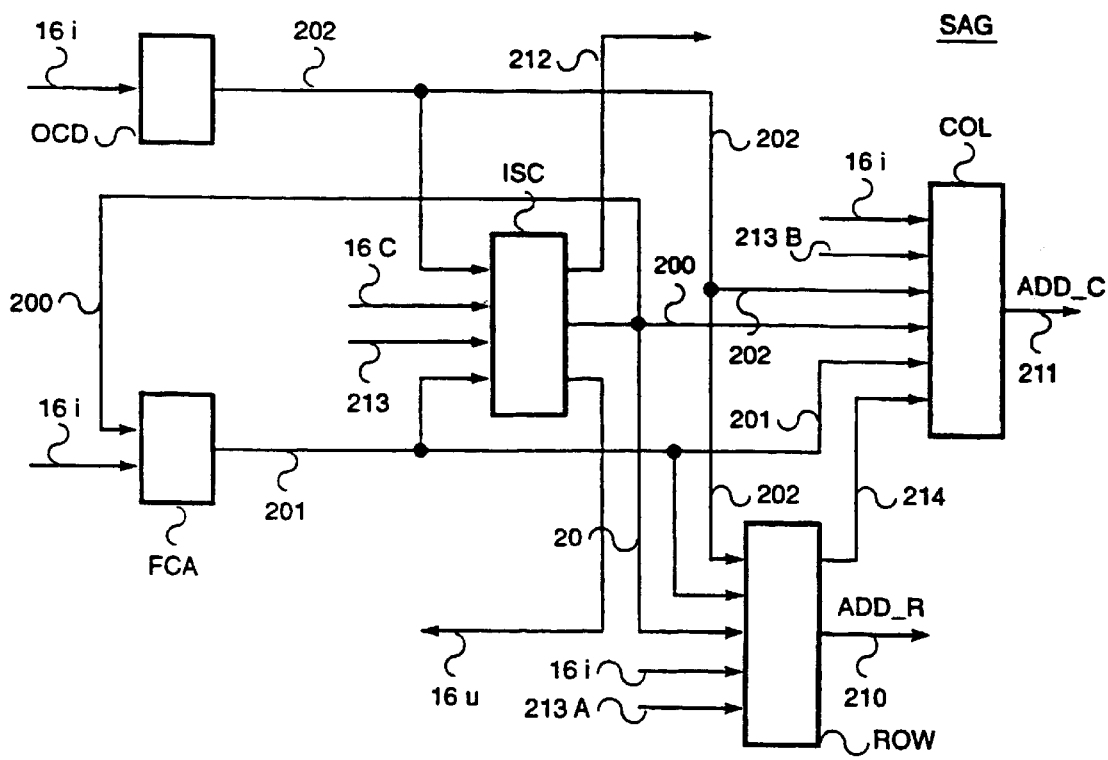
FIGS. 16 to 18 are block diagrams of a unit interfacing the circuit with the external memory.
Figure 17:
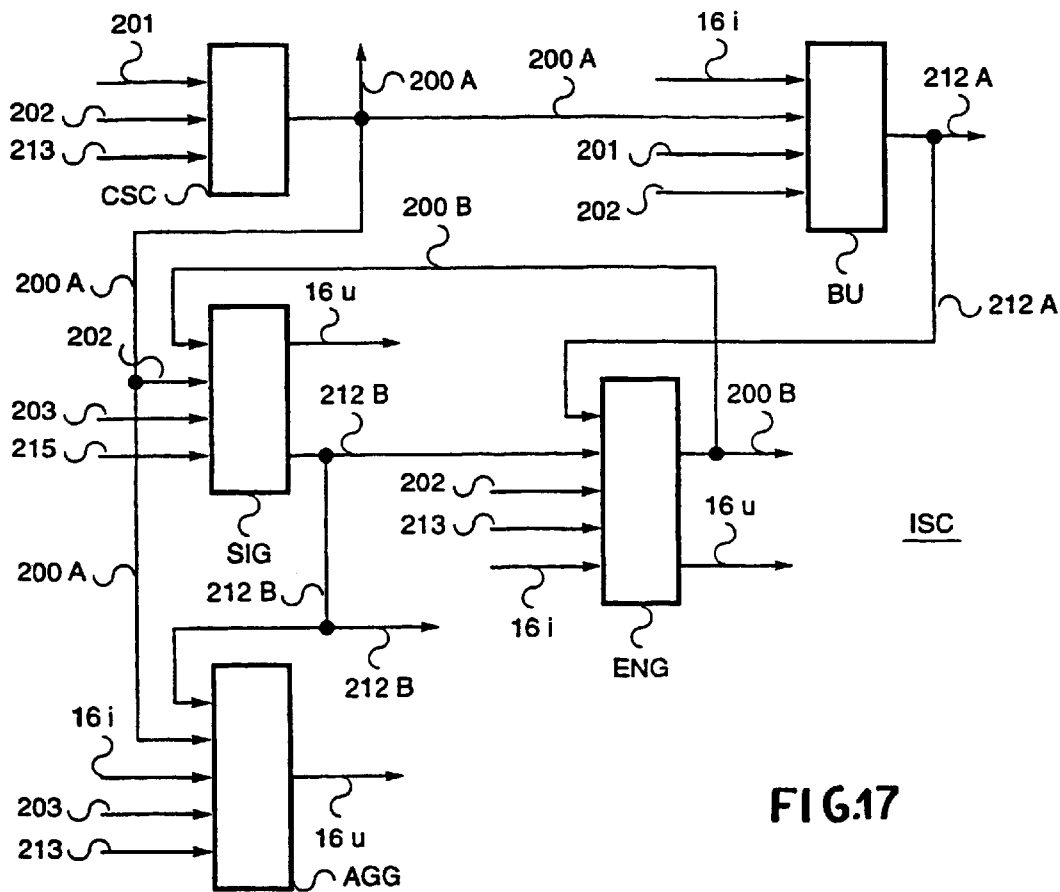

Referring now to FIG. 16 block SAG essentially comprises:
- a first combinatory logic FCA which performs a first processing of the information concerning a region to be extracted from SD or a macro-block to be written into SD;
- two blocks ROW and COL which actually compute the row and column addresses for SD on the basis of information provided by FCA and of the specific organisation of the data in the memory;
- a second combinatory logic OCD for decoding the operation code;
- a state machine ISC, with control unit functions.

Logic network FCA receives from controller GC (FIG. 4) the following information:
- the position in the picture (stripe and column addresses IMBS, IMBC) of a macro-block which serves as starting point for the operations (hereafter called "origin macro-block");
- horizontal and vertical components HMV, VMV of a current motion vector, which indicate the horizontal and vertical displacement of the first pixel in a region to be extracted with respect to the first pixel of the origin macro-block;
- vertical field selection MVFS which, in the case of field reading, indicates whether the field to be read is the first or the second one;
- horizontal and vertical size RH, RV of a region;
- configuration bits L625 and FI_FR_READ which indicate respectively whether the picture has 625 rows or 525 rows and whether reading takes place in frame or field mode; these bits are provided by configuration registers in GC whereas the other signals by microinstruction sequencer SEQ (FIG. 9).

FCA also receives from ISC, through a wire of a line 200, a signal CHROMA, which indicates whether chrominance or luminance pixels are to be extracted.

FCA computes and emits on its outputs 201:
- stripe and column addresses STRIPE_OUT, COLUMN_OUT of the macro-block where the left corner of a region to be extracted or of the macro-block to be written or extracted lies; if the read/write operation concerns vectors, the addresses relate to the origin macro-block; these addresses are provided to circuit ROW computing the row address;
- the number of stripes and columns involved in a region extraction (N_STRIPE and N_COL), the number of pixel rows to be read respectively in the first and in the last macro-block of the region (Y_SH_1MB and Y_SH_LMB) and the number of pixels to be read in each line of the top left and respectively top right macro-blocks in the region (X_SH_1MB and X_SH_LMB); such information is provided to control logic ISC; the row and pixel numbers take into account that the region may be asymmetrically located with respect to the origin macro-block so that only a part of the pixels of the top-left and top-right macro-blocks are to be read (see FIG. 15);
- the position of the top left corner of the region (H_OFFSET and V_OFFSET), which is provided to circuit COL computing the column address.

Decoder OCD receives from control logic UCC (FIG. 9) of global controller GC operation code OP_CODE specifying the operation to be performed (in particular, reading or writing a macro-block, a region of given size, the initialisation vectors or the current vectors and related errors) and enabling signal ADR_VAL. Depending on the value of OP_CODE, OCD emits on output 202 signals READ, WRITE, REFRESH, sent to ISC, and configuration signals RD_WR_CONF and EXTR sent to ROW, COL and ISC to bring the aforesaid blocks into a specific operating mode. In particular, EXTR specifies whether the operation is a region extraction or not, and RD_WR_CONF allows selecting one of the following operating modes: region extraction or macro-block writing; reading/writing initialisation vectors BV (FIG. 14); reading/writing current vectors CV and the related errors; delay of the reference picture Ir.

In practice, blocks ROW and COL transform the information of position in the picture into row and column addresses ADD_R, ADD_C and provide them to SSG, through lines 210, 211, in the presence of the respective request NEWRAS, NEWCAS coming from SSG through respective wires 213A, 213B of a connection which, at the input of other blocks, is indicated in its entirety as 213. For properly computing the addresses for the specific operation, in addition to the information provided by other blocks in SAG and already described above, ROW and COL need vertical field selection signal MVFS (used by ROW), a signal FIFR indicating whether the picture being processed is a frame or a field picture, the configuration bit FI_FR_READ (provided to both circuits), an indication M123 of which of the three pictures stored in SD is involved in the operation (for reading/writing pixels and reading/writing initialisation vectors) and field selection signals TOP, BOT (mutually exclusive with the previous ones). COL also receives from ROW, through connection 214, the stripe and column address of the current macro-block and information about the current field.

Block ISC is to follow the evolution of the operations concerning memory SD on the basis of the information provided by the other blocks in SAG (in particular FCA and OCD), by SSG (line 213) and by circuit IM, to drive blocks ROW, COL according to the specific operation and to manage the dialogue protocol concerning the data exchange between SD and the circuit. Moreover, ISC must provide SSG (through line 212) with the information about the number and the size of the bursts concerned by each operation.

Figure 18:
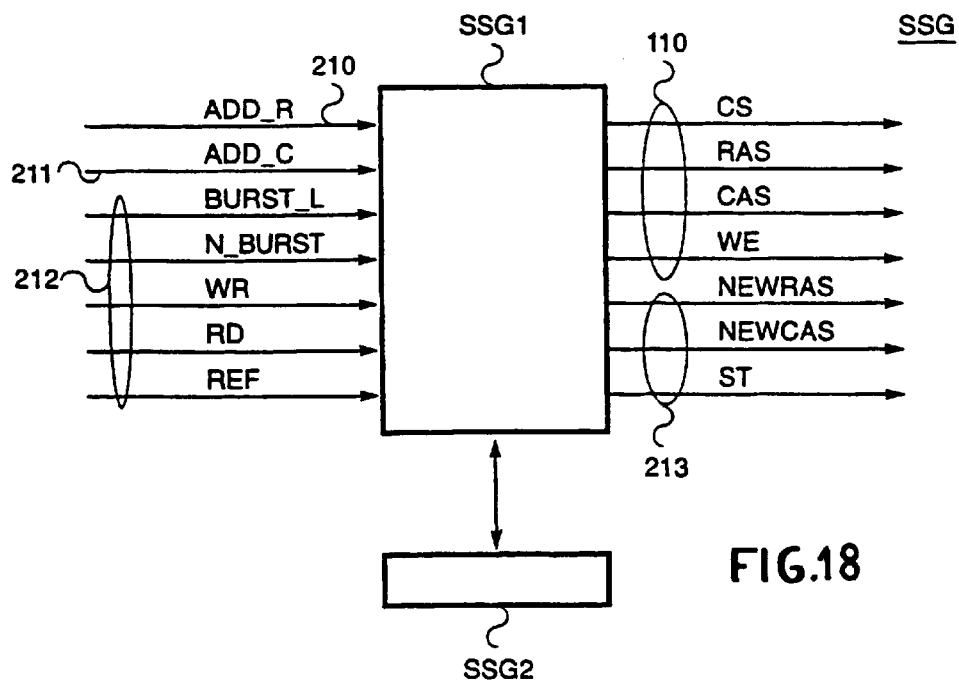

As shown in FIG. 18, block ISC comprises: a counting circuit CSC evaluating the number of macro-block columns and stripes involved in a read/write operation and following the progress of the read/write operation; a circuit BUE generating signals which characterise the number and size of the bursts to be read at each access to SD in the case of region extraction; a circuit SIG generating command signals for SSG and signals driving the data wires of bus 16; a circuit ENG generating enabling signals; and lastly a circuit AGG generating signals for correctly writing the data into memories MF, MM (FIG. 5) of the modules.

More specifically, CSC receives from FCA signals N_STRIPE and N_COL (input 201), from OCD signals READ, WRITE, RD_WR_CONF and EXTR (input 202) and from SSG signals NEWCAS, NEWRAS (input 213), and generates, on an output 200A which is part of line 200 (FIG. 16):

two signals N_STRIPE_O and N_COL_O that have the same meaning as N_STRIPE and N_COL and coincide with them when the operation concerns region or macro-block extraction, whereas in the case of operations on vectors they are obtained through a processing of the latter signals, which takes into account that vector and pixel storage procedures are different; both signals are provided to AGG, as well as to ROW and COL (FIG. 16); N_COL_C is provided to SIG as well;

two signals CONTA_COL, CONTA_STR which provide an indication of the progress of the read operation: these signals have initial values that indicate the number of macro-blocks to be read in each column or respectively in each stripe of the picture and are decremented whenever a macro-block is completely read; these signals are also provided to ROW and COL in block SAG and, within ISC, to AGG, SIG and BUE.

Block BUE generates and sends to SSG, through wires 212A of line 212 (FIG. 16), a pair of signals N_BURST, BURST_L which indicate the number and the size, respectively, of the bursts involved in a read operation from SD; to this end BUE uses the signals emitted by OCD and by CSC and signals Y_SH_1 MB and Y_SH_LMB, X_SH_1 MB and X_SH_LMB, FI_FR_READ provided by FCA. Signals N_BURST, BURST_L are provided also to block ENG.

Block SIG is essentially to provide SSG, through wires 212B of line 212, with signals RD, WR, REF which allow SSG to activate the read, write and refresh operations in SD. For the generation of these signals SIG uses, in addition to the aforesaid signals CONTA_COL, CONTA_STR, signals READ, WRITE, REFRESH, EXTR provided by OCD, requests NEWRAS for new row addresses and a 'memory ready' signal ST, coming from SSG (connection 213), and signals CHROMA and CONTACAS provided by ENG through wires 200B. The latter signal represents the number of NEWCAS signals received by ENG for the current memory bank. These signals altogether allow SIG to recognise the beginning and the end of the read and write operations and their sequence. Signal REF is active during a whole refresh operation; signal RD is reset and set again when two macro-blocks stored in the same bank are to be read in sequence (closure and reopening of the bank); signal WR is similarly reset and set again when passing from reading luminance pixels to chrominance pixels related to the same macro-block. Signals RD and WR are also provided to ENG. When the operation to be performed is a writing into or a reading from SD, circuit SIG generates on one of the wires 16u also an additional signal EN_DQ which sets data wires 16D of bus 16 for data transfer in the direction from SD to IM or in the opposite direction.

Circuit ENG receives signals NEWCAS, NEWRAS, EXTR, READ, WRITE, RD_WR_CONF examined above and, on the basis of this information, it generates on output 200B: a signal BANK1_2 provided to blocks SIG and SAG to indicate the bank involved in the operation; signals CHROMA and CONTACAS, already examined; signals DATA_REQ and DATA_VAL (emitted on wires 16u) to request new data from the units concerned in IM (FIG. 2) in case of writing in SD, and, respectively, to signal the presence of data on bus 16 to the involved units in case of reading from SD.

Lastly block AGG is to generate and send to addressing unit GIN (FIG. 5) in the modules signals X_SHIFT, Y-SHIFT and TOPDOWN which allow data storage in the correct locations in these memories. The first two signals indicate respectively the horizontal and vertical displacement of a memory position which is being read with respect to the beginning of the macro-block; the third one instead may indicate one of the following three events: reading the first macro-block of a region, column change, row change. Block AGG operates on the basis of the information it receives from the other blocks of ISC (seen previously), of the information on the type of operation provided by OCD (FIG. 4) and of the data requests coming from IM.

With reference to FIG. 18, block SSG comprises two logic networks SSG1 and SSG2 of which the first is an actual operating circuit which receives the signals emitted by SAG and generates the commands for SD, whilst the other one is a counting logic which supervises the evolution of the operations performed by SSG1. The Figure shows the various input-output signals of SSG1. Input signals WR, RD, REF, BURST_L, N_BURST and ADD_R, ADD_C have already been discussed. Depending on the combination of inputs and at the appropriate instants SSG1 emits towards SD, on line 211, address ADD_OUT (which is either ADD_R or ADD_C), conventional chip select and write enable signals CS, WE which, in combination with commands RAS, CAS for row and column address selection, allow SD (FIG. 2) to recognise whether address ADD OUT is a row or column address and which completely characterise the operation to be performed at address ADD_OUT; it also emits 'memory ready' signal ST on line 213 towards SAG (FIG. 1) and the requests for new addresses NEWRAS, NEWCAS, examined above.

Control logic SSG2 essentially is to follow the progress of the reading/writing of the L_BURST words in a burst and of the N_BURST bursts. SSG2 essentially comprises register banks where values N_BURST and L_BURST are loaded and updated, and counters which are decremented at each new word/burst read. Two registers are provided for both N_BURST and L_BURST since the information relating to a new burst can arrive from SAG before the previous burst has been completely read, to avoid idle times. A third register is also provided for both N_BURST and L_BURST, which contains the updated value of the respective parameter as it evolves during the operation. Logic SSG2 also takes into account that SD may be unable to accept or emit the data continuously and therefore idle times within a burst or between bursts may occur.

The evolution of the operations is managed by means of some internal signals, of which the following ones have an actual interest for the operations shown in the flow chart:

bank1_2, which has a meaning similar to signal BANK1_2 examined in the description of circuit SAG)

b_l_reg (b_l_reg1, b_l_reg2), n_b_reg (n_b_reg1, n_b_reg2), which indicate the contents of the registers associated to BURST_L, N_BURST (the signal without numerical index is the one for the current value)

b_l_cnt, n_b_cnt, which are the count values for BURST_L, N_BURST, respectively;

reg, that indicates whether the first or the second register is currently in use for BURST_L, N_BURST.

Figures 19, 20:
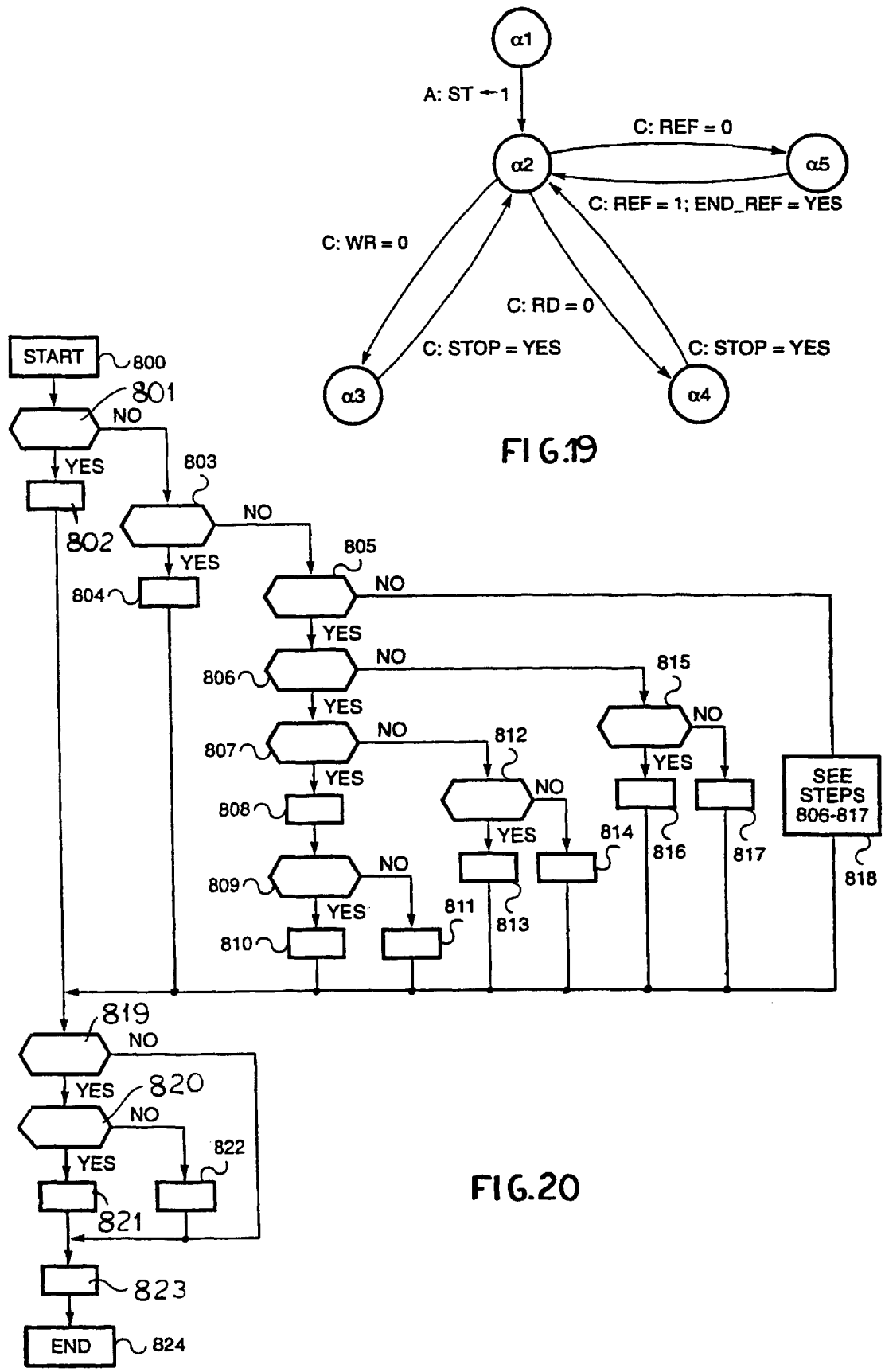
FIGS. 19, 20 are flow charts of the operation of the logic network shown in FIG. 18.

The operations of SSG1 are shown synthetically in the state diagram in FIG. 19. where it is assumed that signals RD, WR, REF are active when at low logic level. Symbol A along the arrows indicates an action taken symbol C the conditions determining the action:

Upon circuit start-up (and after every reset) SSG1 passes to an activation state a1 where it performs some checks required for memory initialisation and programming; at the end of the operations provided for in this state. SSG1 passes to an initial waiting state α2 where it: initialises the output signals and the various internal signals; emits towards SAG (and in particular towards ISC, FIG. 4) signal ST which indicates that the memory is ready to operate; and awaits the arrival of a request for operation from SAG. The subsequent evolution depends on the operation requested and brings SSG1 to a read state α3 or write state α4 or yet to refresh state α5. In case of reading or writing the logic assigns a pre-set value to the various signals CS, RAS, CAS, WE; it initially emits signal ADD_R as signal ADD_OUT for the memory bank concerned and then performs the operations requested, until the read/write request is reset (STOP), for instance because it is necessary to operate on a new macroblock stored in the same bank as the previous one or because stopping of the operation has been requested with an interrupt signal. In any case, before going back to waiting state α2, SSG1 completes an operation already started. Note that a memory like SD operates on bursts of which the length must be higher than a minimum length (two 16-bit word, i. e. 4 bytes), whereas SAG may have requested one-word bursts. Under these conditions SSG1 will modify BURST_L before transferring it to SSG2. This action is described in Appendix I that follows. The refresh operation, on the other hand, as stated, is a continuous operation; therefore SSG1 passes in state α5 when REF is set, and it returns to state α2 at the end of the operation, even if signal REF has been reset before that end.

The operations of SSG2 are shown in the flow chart in FIG. 8 and the conditions that govern the evolution of the operations and the actions performed at each step are reported, for the sake of ease of understanding, in Appendix II. Steps 801, 802 correspond to the initial circuit activation; steps 803–804 concern the check on whether the memory can provide/accept the data and the count stopping in the negative. After check 805 on the identity of the bank of registers concerned, the operations performed by SSG2 are identical whatever the register bank and hence they are indicated in detail only for one of the two banks (steps 806–817). In particular steps 806, 807 entail checking whether the burst involved is the last one and, if so, whether the word is the last one; at steps 809–814 the logic prepares itself to switch to the other register bank if the word is the last one or the next to last one. If the word is neither the last one nor the next to last one, the operations advance word by word until the next to last one is reached. Steps 815–817 refer to the progress of the operations concerning the bursts instead of the words, and they are conceptually similar to the previous ones. Step 818 is the check on reaching the last word of every burst. Lastly steps 819–823 relate to the conclusion of a series of operations and they concern a check on the path followed to reach step 819 and the actions required to move on to the next operation cycle.

It is clear that the above description is given only by way of non limiting example and that the invention includes all changes and modifications which are within the reach of the skilled in the art.

APPENDIX I

Actions carried out by SSG1 when passing to writing or reading state. CSN, RASN, CASN, WEN correspond to signals CS, RAS, CAS, WE mentioned in the specification, and letter N at the end of the symbols merely indicates that the corresponding signal are active at low logic level.

```
CSN <= '0';
RASN <= '0';
CASN <= '1';
WEN <= '1';
ADD_OUT <= ADD_R;
newras_int <= '0';
pre_bank <= ADD_R(11);
bank1_2 <= '0'
reg <= '0';
reg1_2 <= '1';
start <= '1';
only1ras <= '0';
n_b_cont <= N_BURST;
if      BURST_L = 0 then
            b_l_reg <= 1
            b_l_cnt <= 1
else
            b_l_reg <= BURST_L
            b_l_cnt <= BURST_L
```

APPENDIX II

Operations of SSG2 (see flow chart of FIG. 18). The words in Italic are comments to the operations. Signals fcas1, fcas2 are flags concerning emission of command CAS for bank 1 o 2 respectively, fpre1, fpre2 are flags concerning pre-charge (closing) of bank 1 o 2; prefix "del" for those flags indicates delayed re-emission of same.

```
IF start = '1' THEN                                                         (step 801)
    --start = '1' is only for the first time,
    --it is also to start the counter
    bank1_2 <= '0';                                                         (step 802)
    reg <= '0';
    start <= '0';
    ELSIF ((fcas1 and del_fcas1) or (fcas 2 and del_fcas2)) = '1' THEN (step 803)
        --stop the counter count-down                                       (step 804)
```

-continued

```
        --when the fcas (cas-request) are not
        --immediately served
    null;
ELSIF reg = '0' THEN                                    (step 805)
    IF n_b_cnt = 0 THEN                                 (step 806)
        IF b_l_cnt = 0 THEN                             (step 807)
            n_b_cnt <= n_b_reg2;                        (step 808)
            reg <= '1';
            IF b_l_reg2 = 0 THEN                        (step 809)
                b_l_reg <= 1;                           (step 810)
                b_l_cnt <= 1;
            ELSE (step 809)
                b_l_reg <= b_l_reg2;                    (step 811)
                b_l_cnt <= b_l_reg2;
            END IF;
        ELSIF b_l_cnt = 1 THEN                          (step 812)
            b_l_cnt <= b_l_cnt - 1;                     (step 813)
            bank1_2 <= not(bank1_2);
        ELSE                                            (step 812)
            b_l_cnt <= b_l_cnt - 1;                     (step 814)
        END IF;
    ELSIF b_l_cnt = 0 THEN                              (step 815)
        b_l_cnt <= b_l_reg;                             (step 816)
        n_b_cnt <= n_b_cnt - 1;
    ELSE                                                (step 815)
        b_l_cnt <= b_l_cnt - 1;                         (step 817)
    END IF;
ELSIF n_b_cnt = 0 THEN                                  (step 818)
    IF b_l_cnt = 0 THEN
        n_b_cnt <= n_b_reg1;
        reg <= '0';
        IF b_l_reg1 = 0 THEN
            b_l_reg <= 1;
            b_l_cnt <= 1;
        ELSE
            b_l_reg <= b_l_reg1;
            b_l_cnt <= b_l_reg1;
        END IF;
    ELSIF b_l_cnt = 1 THEN
        b_l_cnt <= b_l_cnt - 1;
        bank1_2 <= not(bank1_2);
    ELSE
        b_l_cnt <= b_l_cnt - 1;
    END IF;
ELSIF b_l_cnt = 0 THEN
    b_l_cnt <= b_l_reg;
    n_b_cnt <= n_b_cnt - 1;
ELSE
    b_l_cnt <= b_l_cnt - 1;
END IF;
IF (newras_int and not(del_newras)) = '1' THEN          (step 819)
    IF reg1_2 = 0 THEN                                  (step 820)
        n_b_reg1 <= N_BURST;                            (step 821)
        b_l_reg1 <= BURST_L;
        reg1_2 <= not(reg1_2);
    ELSE                                                (step 820)
        n_b_reg2 <= N_BURST;                            (step 822)
        b_l_reg <= BURST_L;
        reg1_2 <= not(reg1_2);
    END IF;
END IF;
del_fcas1 <= fcas1;                                     (step 823)
del_fcas2 <= fcas2;
del_fpre1 <= fpre1;
del_fpre2 <= fpre2;
del_newras <= newras_int;
```

What is claimed is:

1. Circuit for motion estimation in a video encoder intended to encode a sequence of digitised pictures, which circuit receives aggregates of pixels of a current picture and, for each of said aggregate of pixels (hereinafter referred to as 'current aggregate'), generates one or more vectors representing the displacement of said aggregate with respect to a corresponding aggregate of pixels (hereinafter referred to as 'reference aggregate') in a search window belonging to a reference picture, characterised in that it comprises at least one integrated circuit component (IM; IM1 . . . IMn) including:

at least a pair of operating units (M1, M2) which are independently programmable and are arranged to concurrently process different data of the current picture and of the search window according to a multiple instruction, multiple data processing technique, to perform one of the following functions:

determination of a set of candidate motion vectors for each current aggregate and of an estimation error associated with each candidate vector, each vector in the set being the vector associated with the lowest estimation error for a given prediction mode chosen within a pre-defined set of prediction modes identifying a reference aggregate that best matches the current aggregate;

vector refinement, for improving the identification of the best-matching reference aggregate by effecting a further search in a limited portion of the window itself and by weighting each candidate vector by a weight associated with the amount of bits required for transmitting the vector itself;

a first internal bus (15), to which said operating units (M1, M2) are connected and which is intended for transferring to the component (IM; IM1 . . . IMn) programming and initialisation information or processing parameters coming from an external controller (CP), for conveying monitoring information from the component (IM; IM1 . . . IMn) to said external controller and for allowing information exchange between different units in the circuit;

a second internal bus (16), to which said operating units (M1, M2) are connected and which is intended for conveying video data, processing parameters and vectors associated with the relevant errors obtained as processing result, which are to be written into an external memory (SD) associated with the component (IM, IM1 . . . IMn) or which are read from said external memory (SD);

first interface means (IC) for connecting said first internal bus (15) to a line (12) for information exchange between the component (IM; IM1 . . . IMn) and said external controller (CP);

second interface means (B1 . . . B3, IB) for connecting said second internal bus (16) to input/output lines (6 . . . 10) conveying to the component (IM; IM1 . . . IMn) or outputting from the component (IM; IM1 . . . IMn) video data, processing parameters and processing results;

third interface means (IS) for connecting said second internal bus (16) to a line (11) conveying video data, processing information and vector/error pairs to and from said external memory (SD), and for controlling the access to the external memory (SD);

an internal controller (GC), which is connected to said first and second internal buses (15, 16) and which has to: identify and enable circuit units concerned by a data transfer over said second bus (16); allot different portions of a processing cycle to different units; generate and distribute the general synchronisation to the circuit units; control the global flow of operations in the circuit; synchronise the internal circuit activity with an external synchronisation; and initiate the operations of the operating units (M1,M2).

2. Circuit according to claim 1, characterised in that it further comprises an internal memory (MP) for storing weights to be used in vector refinement, supplied by the external controller (CP), said internal memory being accessible in mutually exclusive way by said operating units (M1, M2) via said first bus (15).

3. Circuit according to claim 1, characterised in that it further comprises a testing unit (TE) arranged to perform a self-testing of said operating units (M1, M2), of memory means included in second interface means (B1, B2, B3; IB) and in said internal controller (GC), and—if present—of said internal memory (MP), the testing unit (TE) performing such self-testing in response to a specific activating instruction and comprising:

test control registers (TCR), storing a plurality of bits each enabling a particular test, which can be either a memory built-in self test or a software controlled built-in self test;

test result registers (TRR) storing a plurality of bits each indicating the result of particular test;

test status registers (TSR) storing a plurality of bits each indicating the running/not running status of a particular test;

a test access control register (TAC), providing the access to the test control, test result and test status registers (TCR, TRR, TSR) to control the tests and to evaluate the test results, providing the serial-to-parallel conversion of serial test data received by the unit and the parallel-to-serial conversion of test data to be outputted, and providing access to said first and second buses (15, 16) to enable reading from and writing into units connected to said buses, for testing purposes.

4. Circuit according to claim 3, characterised in that said memory means and said internal memory (MP) are equipped with built-in self-test modules, and in that the test control, test result and test status registers (TCR, TRR, TSR) are directly connected to said built-in self-test modules and to said operating units (M1, M2) through a memory test bus (18) for controlling the tests and receiving test results and status information.

5. Circuit according to claim 1, characterised in that said operating units (M1, M2) are programmable to perform a selection of the prediction mode, to determine the motion vector corresponding to the prediction mode which results in the better trade-off between encoding quality and amount of information necessary to represent the encoded picture.

6. Circuit according to claim 5, characterised in that it comprises different integrated circuit components for performing candidate vector determination, vector refinement, selection of the prediction mode.

7. Circuit according to claim 5, characterised in that the selection of the prediction mode is carried out by the component(s) performing vector refinement or by the component(s) performing candidate vector determination, in a circuit in which vector refinement is not carried out.

8. Circuit according to claim 1, characterised in that it comprises a first plurality of identical integrated circuit components (IM1 . . . IMn) which are connected in cascade and are all programmed to perform the same function of vector determination or vector refinement, possibly jointly with the prediction selection function, and which receive the same data and share the same external controller (CP).

9. Circuit according to claim 1, characterised in that it comprises a first plurality of identical integrated circuit components (IM1 . . . IMn) which are connected in cascade and are all programmed to perform the same function of vector determination, and, in series to the first plurality, a second plurality of identical integrated circuit components (IM1 . . . IMn) which are connected in cascade and are all programmed to perform the same function of vector refinement, possibly jointly with the prediction selection function.

10. Circuit according to claim 8, characterised in that all components in said first and/or second plurality share the same external memory (SD) and operate on a same search window.

11. Circuit according to claim 8, characterised in that the components in the first and/or second plurality are associated each with an own external memory (SD) and are arranged to operate on different search windows.

12. Circuit according to claim 8, characterised in that a component (IM1 . . . IMn) upstream in the, or a, plurality directly feeds a downstream component with vector/error pairs, obtained as a result of the processing carried out in said upstream component, through a dedicated line (100) or through the same line (9, 10) which conveys processing parameters, the last circuit in the plurality emitting the final result of the processing on the output line (10) for the processing parameters.

13. Circuit according to claim 11, characterised in that a component (IM1 . . . IMn) upstream in the or a plurality feeds a downstream component with vector/error pairs, obtained as a result of the processing carried out in said upstream component, through said external memory (SD).

14. Circuit according to claim 1, characterised in that, for the determination of the candidate vectors, said operating units (M1, M2) are programmable to execute a genetic algorithm which uses a vector population including a first group of vectors that take into account the temporal and spatial correlations and that, at the end of a processing cycle, are transferred from the operating units (M1 . . . M2) to the external memory (SD) whence they are read by the operating units (M1 . . . M2) at the beginning of a subsequent cycle and used to build an initial vector population for said subsequent cycle.

15. Circuit according to claim 14, characterised in that said operating units (M1, M2) are arranged to write into said external memory (SD), at the end of the processing of a current aggregate of pixels, the vector associated with the lowest error for a predetermined prediction mode, said vector being read by said operating units (M1, M2) when an initial vector population is to be created.

16. Circuit according to claim 1, characterised in that each operating unit (M1 . . . M2) comprises:

a vector generation unit (GV) which is to generate motion vectors representing displacement of a current aggregate of pixels with respect to a plurality of reference aggregates which are tested in the search window, by executing instructions loaded into the unit (GV) during an initialisation phase and relevant to a pre-determined algorithm for candidate vector determination or refinement or yet prediction selection;

first and second internal memory units (MM, MF) connected to said second bus (16) and respectively intended to store said current aggregate of pixels and the pixels of the respective search window, supplied by said external memory;

an address generation unit (GIN), which is to generate the read and write addresses for said first and second internal memory units (MM, MF) starting from vectors supplied by the vector generation unit (GV);

a pixel processor (CE, CCE) which receives from said memory units (MM, MF) pixels of the current aggregate and of a reference aggregate and from said vector generation unit (GV) the vectors and information about the kind of operation the pixel processor (CE) is to perform, the pixel processor performing on said pixels arithmetical operations required either for determining said estimation error, by comparing groups of pixels in the current aggregate with homologous groups of pixels in a number of reference aggregates identified in the search window by vectors generated by said vector generation unit (GV), or for selecting the proper prediction mode, the pixel processor calculating said estimation error either with respect to an entire aggregate or to different portions of the aggregates;

a sorting unit (SU), which is connected to said pixel processor (CE; CCE) from which it receives the motion vectors and the relevant errors together with information on the operating mode, and comprises means (CR, CL) for separating the vectors according to the prediction mode, recognising the vector associated with the lowest error for each prediction mode and storing such vector as the candidate vector for that prediction mode together with the respective error, said separating, recognising and storing means (CR) being accessible by said external memory (SD) and by other units in the circuit for writing vector/error pairs computed during processing of previous aggregates and for reading vector/error pairs retained at the end of the processing relevant to the current aggregate, and by said vector generation unit (GV) for reading vector/error pairs written by the external memory (SD);

a third internal bus (20) to which said address generation unit (GIN), said pixel processor (CE, CCE) and said sorting unit (SU) are connected, said third bus (20) being associated with means (IBU) for establishing connection between said third bus (20) and said first internal bus (15), or between said third bus (20) and said vector generating unit (GV), or between said first internal bus (15) and said vector generating unit (GV).

17. Circuit according to claim 14, characterised in that each operating unit (M1, M2) further comprises a generator (GVC) of random vectors, connected to said third internal bus (20) to supply the vector generation unit (GV) with random vectors to be used in building a vector population required for performing said genetic algorithm for the determination of the candidate vectors.

18. Circuit according to claim 17, characterised in that said random vector generator (GVC) is a generator of random numbers with a pseudo-Gaussian distribution and is arranged to generate a configurable distribution for both a horizontal and a vertical component of each vector.

19. Circuit according to claim 16, characterised in that said sorting unit (SU) also comprises means (SR, SL) for sorting the vectors provided by the pixel processor (CE, CCE) also according to the value of one among the estimation errors computed by said processor and for storing, at the end of the processing concerning a aggregate of pixels, a number of vectors exhibiting the lowest errors together with the respective errors, said sorting and storing means (SR, SL) being accessible by said external memory (SD) and by other units in the circuit for writing vector/error pairs computed during processing of previous aggregates and for reading vector/error pairs retained at the end of the processing relevant to the current aggregate, and by said vector generation unit (GV) for reading of vector/error pairs written by the external memory (SD) in an initialisation phase of the building of the vector population.

20. Circuit according to claim 16, characterised in that said vector generation unit (GV) comprises a pipelined RISC processor including a first bank of registers (GPR) comprising two sets of registers of which one ('vector registers') is arranged to store vectors and the other ('error registers') is arranged to store errors, each vector register being in turn divided into two parts respectively storing a horizontal component and a vertical component of the respective vector; a same logical address being allotted to a vector register and an error register so as to establish and keep association between each vector and the relevant error, selection of data to be processed out of a vector register or an error register associated with a same address being carried out by means of an operation code contained in instructions stored in the unit.

21. Circuit according to claim 16, characterised in that said pixel processor (CE, CCE) comprises a pipelined arithmetic unit (CE) arranged to receive from said first and second memory units (MM, MF), for said error calculation, corresponding groups of pixels belonging to the current aggregate and to a reference aggregate, and to perform on said pixels the following operations:

a1) letting through unaltered the pixels in a group belonging to a reference aggregate; or a2) effecting an interpolation between adjacent pixels in a group or between pixels in subsequent groups, execution of operations a1) and a2) or of different interpolations in operation a2) being mutually exclusive and being determined by control signals provided by a control unit (CCE) in the processor;

b) comparing homologous pixels in said corresponding groups and calculating an error relevant to a group;

c) accumulating the errors relevant to all groups in a aggregate or in a aggregate portion to obtain an accumulated error;

d) averaging the accumulated error.

22. Circuit according to claim 21, characterised in that said arithmetic unit (CE) is arranged to calculate, before the error calculating operation in step b), a mean value of the pixel aggregate or aggregate portion and to subtract said mean value from the error calculated.

23. Circuit according to claim 21, characterised in that said arithmetic unit (CE) is arranged to calculate, in a circuit performing prediction selection, a cost associated with an intra-picture encoding, said cost calculation requiring comparing pixels in a current aggregate with a mean value thereof, accumulating the comparison results and averaging the accumulated value.

24. Circuit according to claim 16, characterised in that each operating unit (M1, M2) further comprises registers (RL), also connected to said third internal bus (20), for temporary storage of information which is provided by said internal controller (GC) and which is to be read by said vector generation unit (GV).

25. Circuit according to claim 16, characterised in that said second memory unit (MF) is made of a group of independently accessible memory elements, providing in the whole a storage capacity as required for storing the pixels of a search window comprising, at least for the generation of candidate vectors, a significant number of said reference aggregates; and in that the addressing means (GIN) for said second memory (MF) are arranged to address said elements so that each writing operation concerns individual memory elements and causes updating of at least one entire element, and reading concerns a plurality of memory elements and randomly chosen aggregates of pixels, and causes simultaneous transfer of all pixels in a group to said pixel processor (CE).

26. Circuit according to claim 16 if referred to claims 3 and 4, characterised in that said operating units (M1, M2) further comprise a memory testing unit (UTM), connected on the one side to said testing unit (TE) for receiving control information and sending test results and status information, and connected on the other side to individual elements in said first and second memory units (MM, MF) for addressing a specific memory element concerned by the test, sending test data to the element and receiving test results therefrom.

27. Circuit according to claim 26, characterised in that said memory testing unit (UTM) is connected to said third internal bus (20) for access to and testing of an instruction memory of said vector generation unit (GV).

28. Circuit according to claim 1, characterised in that said second interface means (B1 . . . B3, IB) comprise first connection means (B1 . . . B3) for connection of said second internal bus (16) to input/output lines (6, 7, 8) conveying video data, said first connection means (B1 . . . B3) being arranged to connect said second bus (16) to two input lines (6, 7), one of which supplies the component (IM, IM1 . . . IMn) with pixels of a current picture, whatever the function performed by the component (IM; IM1 . . . IMn), and the second (7) is active when the component (IM; IM1 . . . IMn) performs vector refinement and supplies it with the pixels of a reference picture.

29. Circuit according to claim 28, characterised in that said second interface means (B1 . . . B3, IB) comprises second connection means (IB) for connection of said second internal bus (16) to input/output lines (9, 10; 100) conveying processing parameters and/or processing results, said second connection means (IB) being also connected to said first internal bus (15), for allowing the component (IM) to receive processing parameters from the external controller (CP).

30. Circuit according to claim 29, characterised in that said second connection means (IB) comprise:

first input and output interfaces (IIF1, UIF1) for data parallelism conversion between the formats used on said input/output lines (9, 10; 100) conveying processing parameters and/or processing results and on said second bus (16) and for data synchronisation;

buffer means (IBB) for temporary storage of the processing parameters or vector/error pairs obtained as processing result in the component or coming from upstream components (IM, IM1 . . . IMn);

a control unit (IBC) which is to: address the buffer means (IBB) according to an addressing law depending on the function performed by the component and the kind of information; extract from a line (9) conveying processing parameters to the component and store information specific for a picture, to be made available to all other units in the component; organise information to be emitted onto a line (10) outputting processing parameters and vector/error pairs; control read and write operations involving said first internal bus (15).

31. Circuit according to claim 30, characterised in that said buffer means (IBB) comprise a plurality of buffer units (B4 . . . B7) where:

for candidate vector determination, said buffer units (B4 . . . B7) are organised into two distinct groups of which one is always dedicated to the information to be organised and emitted by the control unit (IBC) and the other manages vectors and errors;

for vector refinement, one unit stores incoming processing parameters and the other units store vector/cost pairs to be sent to other units in the component, the units (B4 . . . B7) being cyclically entrusted with the storage of the processing parameters in such a manner that reading of the parameters stored in a unit takes place after all units have been involved in a writing cycle.

32. Circuit according to claim 8, characterised in that the second connection means (IB) further comprise:

a comparison logic (CM), which is enabled in the components of a circuit comprising at least one of said first and second pluralities of cascaded components and which receives vector/error pairs locally calculated and vector/error pairs calculated by an upstream component; and which compares the errors of homologous vectors and propagates to a downstream component the vectors associated with the lower costs;

second input and output interfaces (IIF2, UIF2) interfacing said comparison logic (CM) with a dedicated line (100) intended for transferring the vectors and the costs between subsequent components in the plurality.

33. Circuit according to claim 1, characterised in that said internal controller (GC) comprises:

an instruction sequencer (SEQ), storing a group of instructions, loaded into said sequencer (SEQ) during an initialisation phase of the circuit and concerning transfer of pixels and/or vectors over said second internal bus (16) or yet transfer of processing parameters into or between registers of the internal controller itself;

a program counter (CPR) which controls sequential execution of said instructions;

a control logic (UCC), activated upon receipt of a start signal indicating that the internal controller (GC) is ready to operate, and comprising decoding means, which decode the instructions generated by the sequencer (SEQ), and a sequential logic which, for each instruction, is to enable other units in the component to perform an operation specified in said instruction and to drive said program counter (CPR), at the end of a time allotted to execution of said instruction, so that it makes the instruction sequence to proceed, evolution of the sequential logic being controlled by synchronism signals (SYN) generated in the internal controller (GC);

a second bank of registers (RG1), including configuration registers, intended to store permanent information supplied by said external controller, as well as registers intended to store variable information which are specific for a pixel aggregate or a picture, one register in the bank providing the control logic (UCC) with said start signal;

a group of counters (CNT), which is to: control, in a manner programmable by the configuration registers in the second bank of registers (RG1), the start of processing and data output operations; generate said synchronism signals (SYN) and to activate different units in the component at instants which also are programmable by said configuration registers, said counters (CNT) receiving, for the execution of such tasks, synchronism signals associated with incoming data and external clock signals (CK);

a third bank of registers (RG2), storing said operating parameters concerned by parameter transfer instructions generated by said sequencer (SEQ), at least some of the registers in the third bank being accessible by other units in the component for reading operating parameters of interest for said other units or for writing operating parameters to be used in building output information governing pixel transfer over said second internal bus (16);

an output logic network (LUS) which comprises a multiplexing unit arranged to build said output information starting from values supplied by said counters (CNT) and from information stored at least in said second bank of registers (RG1).

34. Circuit according to claim 33, characterised in that said output logic network (LUS) further comprises selection means responsive to information about the type of operation provided by said control logic (UCC) and by said second and third bank of registers (RG1, RG2) to control building of said output information either from default values provided by said counters (CNT) and said second bank of registers (RG1), or from programmable values, provided by said third bank of registers (RG2).

35. Circuit according to claim 33, characterised in that said output information comprises: the location of a picture in the external memory (SD); the position of the current aggregate of pixels within a picture being processed; the position of a picture region concerned by a pixel transfer operation; and the size of the region.

36. Circuit according to claim 1, characterised in that said third interface means (IS) comprise:

an address generating network (SAG) which receives from the component (IM) information concerning the type of operation to be performed in the memory and a picture portion involved in the operation, and processes such information to convert it into:

addressing signals (ADD_R, ADD_C) which are specific for one of the following operations: i) writing/reading pixels belonging to one or more pictures; ii) writing/reading processing results; iii) memory refresh; and which allow access to the memory to write/read pixels related to picture portions whose sizes are communicated each time by the component (IM) and to write/read processing results concerning one or more pixel aggregates, and into information (N_BURST, BURST_L) about the amount of data involved in an access to the memory for a write/read operation, the amount of data to be written/read at each access being variable in the course of the operation according to said information on the amount of data (N_BURST, BURST_L);

a command generating network (SSG) which receives the information and the addressing signals(N_BURST, BURST_L, ADD_R, ADD_C) generated by the address generating network (SAG) and processes them generating command signals which can be directly used by the memory.

37. Circuit as claimed in claim 36, characterised in that said address generating network (SAG) comprises:

a first combinatory logic circuit (OCD), which receives from the internal controller (GC) a code indicating the type of operation to be performed and an enabling signal enabling it to decode said operation code, thereby to emit signals indicating that the operation is a read, a write or a refresh operation together with configuration signals used by other units in the address generating network (SAG) to predispose themselves for a particular read/write operation;

a second combinatory logic circuit (FCA) which performs a first processing of the information concerning the picture portion involved in a reading or writing and which:

receives: from the internal controller (GC), information about the position and the size of such picture portion; from the first combinatory circuit (OCD), configuration signals concerning the characteristics of the picture and the operating modes; from a control circuit (ISC), also belonging to the address generating network (SAG), a signal that indicates whether a pixel read/write operation concerns luminance or chrominance pixels; and computes and emits: information about the position in the picture of an initial pixel aggregate and of the first pixel of the initial aggregate, in the case of pixel reading/writing, or about the position in the picture of the pixel aggregate to which a processing result is associated, in the case of reading/writing of processing results; information about the number of pixel aggregates involved; and, in the case of a reading of a region that extends over multiple aggregates and involves only a subset of pixels in some of these aggregates, information about the size of the subset involved;

said control circuit (ISC), which is to: follow the evolution of the operations in the memory according to the information provided by the first and second combinatory circuits (OCD, FCA), by the command generating network (SSG) and by the internal controller (GC); provide said command generating network (SSG) with the signals indicating whether the operation is a reading, a writing or a refresh and with the information (N_BURST, BURST_L) about the amount of data; and manage the dialogue with the component (IM) concerning the transfer of pixels or results of processing operations between the memory (SD) and the component (IM);

a third and a fourth combinatory logic circuit (ROW, COL) which, on the basis of the configuration signals and of control signals provided by the control circuit (ISC), convert position information within a picture, provided by the second combinatory circuit (FCA), into row and respectively column addresses for the memory (SD) and provide the command generating network (SSG) with such addresses, in the presence of a respective request for row or column address (NEWRAS, NEWCAS).

38. Circuit as claimed in claim 37, characterised in that said control circuit (ISC) comprises:

a counting circuit (CSC) which is to evaluate the number of pixel aggregates in the picture portion involved in a read/write operation, by processing, on the basis of information about the type of operation and of the configuration signals provided by the first combinatory circuit (OCD), the information about such number of aggregates provided by the second combinatory circuit (FCA), and which is also intended to follow the evolution of writing/reading operations starting from the address requests coming from the command generating network (SSG);

a fifth combinatory circuit (BUE), which is to generate and to send at least to said command generating network (SSG) the information (N_BURST, BURST_L) on the amount of data to be written or read, obtained from the position information within the picture provided by the second combinatory circuit (FCA) and from the information about the number of pixel aggregates provided by the counting circuit (CSC);

a first sequential logic circuit (SIG), which, by using the information about the type of operation provided by the first combinatory circuit (OCD), information about the progress of the read/write operations provided at least by the counting circuit (CSC) and the address requests provided by the command generating network (SSG), generates a group of signals (RD, WR, REF) for starting or stopping read, write and refresh operations in the memory (SD), to be provided to the command generating network (SSG), and a signal enabling either data transfer direction over said second internal bus (16);

a second sequential logic circuit (ENG) which, by using the information about the type of operation, configuration signals coming from the first combinatory circuit (OCD), the information (N_BURST, BURST_L) about the amount of data involved in an operation provided by the counting circuit (CSC) and the address requests coming from the command generating network (SSG), generates:

signals indicative of the progress of the operations, provided to the first sequential logic circuit (SIG) and to a third sequential logic circuit (AGG), also belonging to the control circuit (ISC), and said signal indicative of whether the operation concerns luminance or chrominance pixels, sent to said second combinatory circuit (FCA) and to the first sequential logic circuit (SIG);

signals for managing the dialogue between the external memory (SD) and the component (IM);

said third sequential logic circuit (AGG) which, in the case of data transfer from the memory (SD) to the component (IM), generates control signals for data storage into the operating units (M1, M2) of the component, on the basis of the information about the type of operation provided by the first combinatory circuit (OCD), of position information provided by the second combinatory circuit (FCA) and of information about the number of pixel aggregates involved in the operation, provided by said counting circuit (CSC).

39. Circuit as claimed in claim 36, characterised in that said command generating network (SSG) comprises:

an operating circuit (SSG1) which receives from the address generating network (SAG) the addresses, the signals indicating the type of operation and the information about the amount of data involved in the operation and emits the command signals for the memory (SD) and the requests for new addresses, and a control circuit (SSG2) which supervises the operations of the operating unit and causes emission of the various command and request signals according to the evolution of the operations themselves.

* * * * *